(12) United States Patent
Judy

(10) Patent No.: US 11,147,195 B2
(45) Date of Patent: Oct. 12, 2021

(54) FARADAY ENCLOSURE APPARATUS AND METHOD OF MANUFACTURING SAME

(71) Applicant: Merakai, LLC, Santa Barbara, CA (US)

(72) Inventor: Ryan Judy, Santa Barbara, CA (US)

(73) Assignee: Merakai, LLC, Santa Barbara, CA (US)

( * ) Notice: Subject to any disclaimer, the term of this patent is extended or adjusted under 35 U.S.C. 154(b) by 0 days.

(21) Appl. No.: 15/734,441

(22) PCT Filed: Jun. 3, 2019

(86) PCT No.: PCT/US2019/035263
§ 371 (c)(1),
(2) Date: Dec. 2, 2020

(87) PCT Pub. No.: WO2019/232547
PCT Pub. Date: Dec. 5, 2019

(65) Prior Publication Data
US 2021/0227727 A1    Jul. 22, 2021

Related U.S. Application Data

(60) Provisional application No. 62/679,815, filed on Jun. 2, 2018.

(51) Int. Cl.
*H05K 9/00* (2006.01)
(52) U.S. Cl.
CPC ......... *H05K 9/0018* (2013.01); *H05K 9/0043* (2013.01); *H05K 9/0081* (2013.01)

(58) Field of Classification Search
CPC .......................... H05K 9/0043; H05K 9/0018
See application file for complete search history.

(56) References Cited

U.S. PATENT DOCUMENTS

| | | | |
|---|---|---|---|
| 4,977,296 A | 12/1990 | Hemming | |
| 5,545,844 A | 8/1996 | Plummer, III et al. | |
| 5,595,801 A | 1/1997 | Fahy et al. | |
| 6,294,729 B1 | 9/2001 | Kaplo | |
| 6,630,220 B1 | 10/2003 | Veiga | |
| 7,687,790 B2 | 3/2010 | Utschig et al. | |
| 8,308,489 B2 | 11/2012 | Lee et al. | |
| 8,435,617 B2 | 5/2013 | Hannon | |
| 8,790,432 B2 | 7/2014 | Roehmer et al. | |
| 10,709,044 B1 * | 7/2020 | Judy | H05K 9/0015 |
| 10,939,595 B1 * | 3/2021 | Abouhatsira | H05K 9/009 |
| 2003/0091777 A1 | 5/2003 | Jones et al. | |
| 2007/0199738 A1 | 8/2007 | Gabower | |

(Continued)

*Primary Examiner* — Hung V Ngo
(74) *Attorney, Agent, or Firm* — Lance M. Pritikin

(57) ABSTRACT

A Faraday enclosure apparatus and method for manufacturing same are disclosure. The enclosure may comprise one or more sewn seam portions constructed to prevent signal leakage through stitch apertures in the seam. A vestibule section facilitates signal-shielded movement of electronic devices between the ambient environment and the main cavity of the enclosure. A connector filter may be mounted to extend through a wall of the enclosure to manage wired power and signal communications entering and exiting the main cavity of the enclosure. Foldable side walls facilitate the collapsibility of the enclosure for compact transport and storage.

25 Claims, 15 Drawing Sheets

(56) References Cited

U.S. PATENT DOCUMENTS

| | | | |
|---|---|---|---|
| 2009/0067150 A1* | 3/2009 | Ito | H05K 9/0043 |
| | | | 361/818 |
| 2010/0100997 A1 | 4/2010 | Lee et al. | |
| 2010/0270070 A1* | 10/2010 | Bradley | H05K 9/0043 |
| | | | 174/378 |
| 2011/0047672 A1 | 3/2011 | Hatfield | |
| 2012/0061134 A1 | 3/2012 | Kennedy | |
| 2012/0195530 A1* | 8/2012 | Kennedy | H04B 15/00 |
| | | | 383/107 |
| 2012/0228020 A1 | 9/2012 | Winch et al. | |
| 2014/0366250 A1* | 12/2014 | Barone | H05K 9/0043 |
| | | | 2/251 |
| 2015/0060129 A1 | 3/2015 | Judy et al. | |
| 2017/0266871 A1 | 9/2017 | Kui | |
| 2019/0021407 A1 | 1/2019 | Howland | |

\* cited by examiner

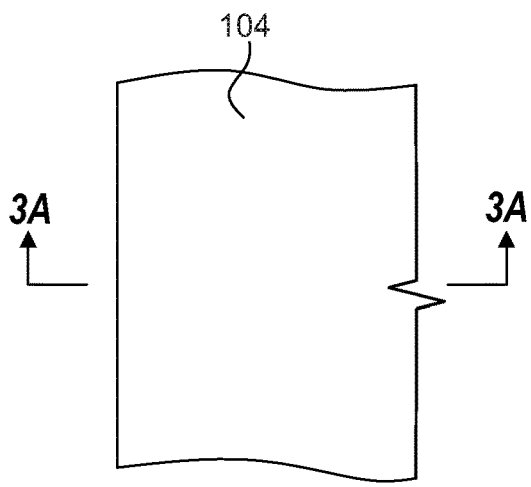
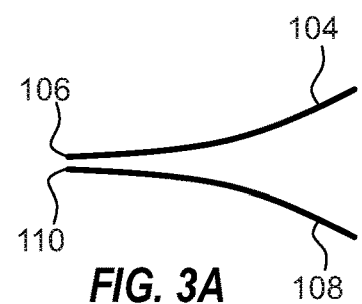
FIG. 3
FIG. 3A
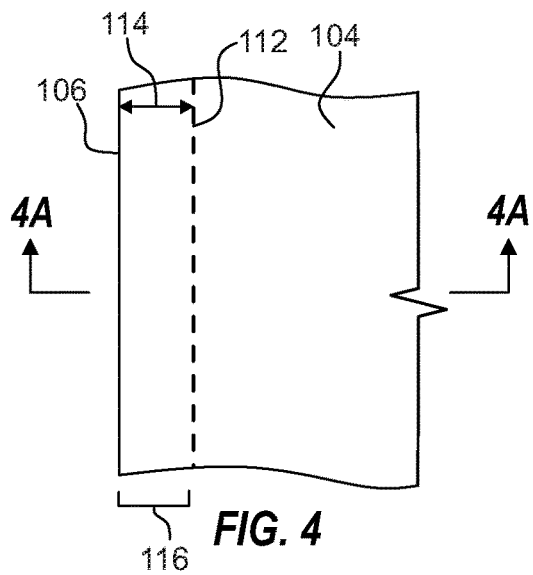
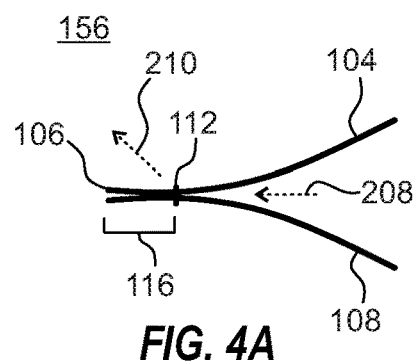
FIG. 4
FIG. 4A
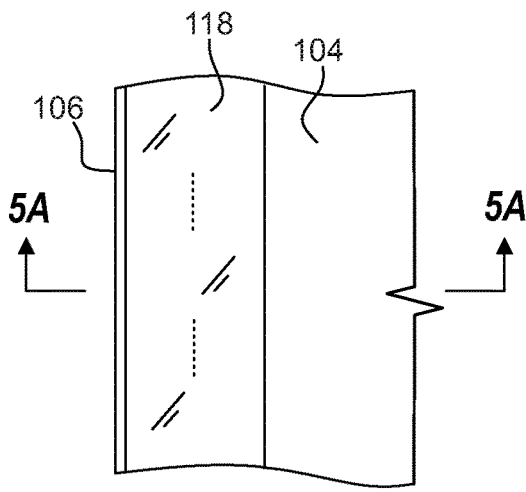
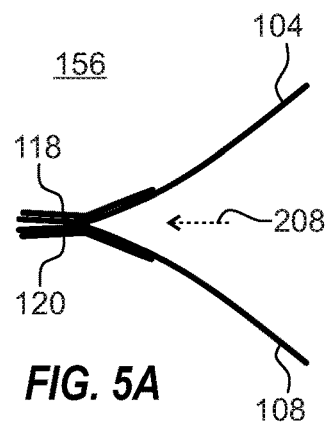
FIG. 5
FIG. 5A

FARADAY ENCLOSURE APPARATUS AND METHOD OF MANUFACTURING SAME

RELATED APPLICATIONS

This application is a U.S. national stage of PCT International Patent Application No. PCT/US2019/035263 having an international filing date of Jun. 3, 2019, which claims the benefit of U.S. Provisional Application No. 62/679,815 filed Jun. 2, 2018. All of the above-identified applications are incorporated by this reference in their entireties for all purposes as if fully set forth herein.

TECHNICAL FIELD

The present disclosure relates generally to the field of electromagnetic shielding enclosures. More particularly, the present disclosure relates to seam construction, vestibules, signal filtering and collapsibility of electromagnetic-signal-shielding enclosures.

BACKGROUND

Radio frequency shielded enclosures are used for many purposes, most typically wireless device testing, data security, and forensics investigations. Many types of RF enclosure products exist in the conventional art, but they each tend to possess a limited feature set focused on the anticipated primary application of the respective enclosure product. The set of features available in any given conventional RF enclosure have remained largely constant over time, and have generally not strayed from the feature set most commonly seen in their fundamental product categories. For example, a particular conventional enclosure may be large and tent-sized with a vestibule style opening, but not small and desktop-sized with a vestibule-style opening. The manufacturers of these conventional enclosure products have historically designed them within the seemingly-accepted constraints of a particular product category. Accordingly, conventional shielded enclosures tend to lack the ability to cater to a wide range of usage scenarios.

What is needed is a shielded enclosure that is capable of catering to a wide range of usage scenarios, by encompassing a combination of features previously unachieved in one single product. Preferred embodiments of the shielded Faraday enclosures disclosed herein may be soft-sided and desktop-sized, while exhibiting characteristics of a rigid enclosure or a larger enclosure like a shielded tent.

SUMMARY

Certain deficiencies of the prior art may be overcome by the provision of one or more embodiments of a Faraday enclosure apparatus and methods in accordance with the present disclosure.

BRIEF DESCRIPTION OF THE DRAWINGS

Further advantages of the present invention may become apparent to those skilled in the art with the benefit of the following detailed description of the preferred embodiments and upon reference to the accompanying drawings in which:

FIG. 3 is a diagrammatic partial view of a first stage precursor of an example seam portion being constructed in accordance with the present disclosure;

FIG. 3A is a diagrammatic cross-sectional view taken along lines 3A-3A in FIG. 3, showing the selected first and second shielding layers with their edges placed into alignment with one another;

FIG. 4 is a diagrammatic partial view of a second stage precursor of an example seam portion being constructed in accordance with the present disclosure, showing an inboard stitching line having been generated FIG. 4A is a diagrammatic cross-sectional view taken along lines 4A-4A in FIG. 4, showing the inboard stitching line and the resulting shielding allowance flap;

FIG. 5 is a diagrammatic partial view of a third stage precursor of an example seam portion being constructed in accordance with the present disclosure, showing the first conductive adhesive element affixed to the first shielding layer in a manner which straddles and seals the inboard stitching line;

FIG. 5A is a diagrammatic cross-sectional view taken along lines 5A-5A in FIG. 5, showing the first and second conductive adhesive elements having been affixed to the respective shielding layer in a manner which straddles and seals the inboard stitching line;

DETAILED DESCRIPTION OF THE PREFERRED EMBODIMENTS

Figure 1:
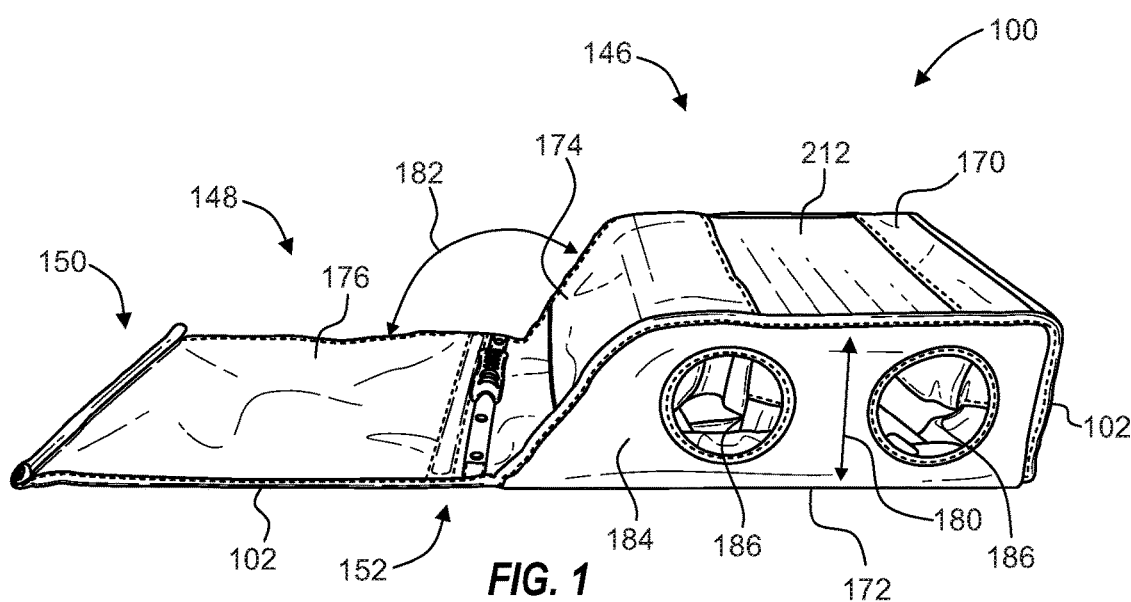
FIG. 1 is a diagrammatic perspective view of one example implementation of a Faraday enclosure apparatus in accordance with the present disclosure.

Referring now to the drawings, like reference numerals designate identical or corresponding features throughout the several views.

Features of particular preferred embodiments of a Faraday enclosure apparatus and methods of manufacture are disclosed herein. However, alternate embodiments of the Faraday enclosure apparatus and method may be constructed with fewer or more features, components and steps than those shown and described in connection with the illustrated embodiments.

Example embodiments of a Faraday enclosure apparatus in accordance with the present disclosure are shown generally at 100.

Referring to FIG. 1, particular embodiments of a Faraday enclosure apparatus 100 may comprise one or more than one seam portion 102. Referring to FIG. 8A, the seam portion 102 may include, for example, a first shielding layer 104 and a second shielding layer 108. Referring to FIG. 3A, the first shielding layer 104 may have a first shielding edge 106 and may be comprised of electromagnetic shielding material. Similarly, the second shielding layer 108 may have a second shielding edge 110 and may be comprised of electromagnetic shielding material. Electromagnetic shielding material may be, for example, an electrically-conductive foil or fabric conventionally used for RF/EMI shielding purposes, or the like. Referring to FIGS. 4 and 4A, an inboard stitching line 112 may extend in parallel with the first shielding edge 106 at a first distance 114 therefrom. The inboard stitching line may stitchingly secure the first shielding layer 104 to the second shielding layer 108, thereby defining a shielding allowance flap between 116 the inboard stitching line 112 and the first and second shielding edges.

As illustrated in FIG. 4A, the piercing of the first stitching line 112 through the first and second shielding layers may provide a pathway for electromagnetic frequency (EMF) signals 208 to leak in or out through the seam (EMF leakage illustrated at 210) without providing a solution to this problem. Referring to FIGS. 5 and 5A, a first conductive adhesive element 118 may be affixed (for example, adhered) to the first shielding layer 104 in straddling sealing engagement with the inboard stitching line 112. Similarly, a second conductive adhesive element 120 may be affixed (for example, adhered) to the second shielding layer 108 in straddling sealing engagement with the inboard stitching line 112.

Figure 6:
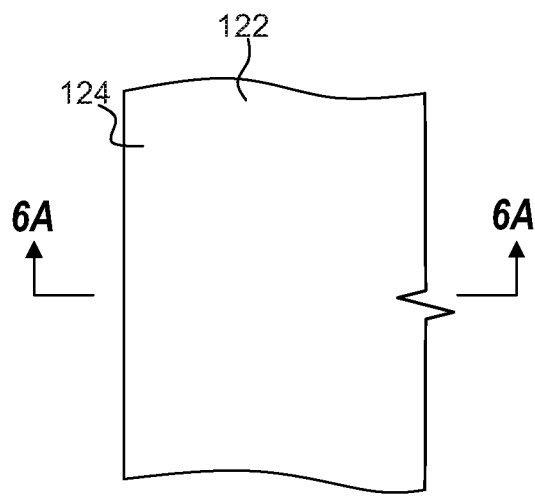
FIG. 6 is a diagrammatic partial view of a fourth stage precursor of an example seam portion being constructed in accordance with the present disclosure.
Figure 6A:
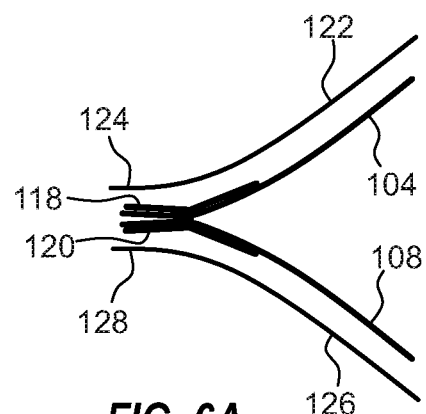
FIG. 6A is a diagrammatic cross-sectional view taken along lines 6A-6A in FIG. 6, showing the first and second protective layers being aligned with the third stage precursor of the seam portion.
Figure 7:
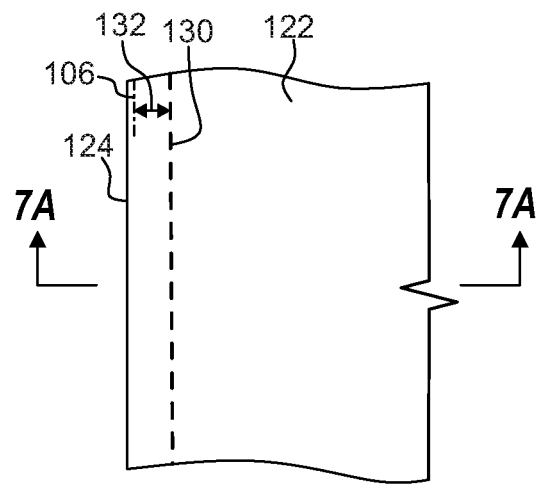
FIG. 7 is a diagrammatic partial view of a fifth stage precursor of an example seam portion being constructed in accordance with the present disclosure, showing the outboard stitching line having been produced.
Figure 7A:
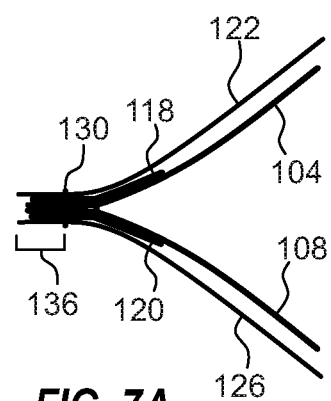
FIG. 7A is a diagrammatic cross-sectional view taken along lines 7A-7A in FIG. 7, showing the outboard stitching line securing the first and second protective edge portions to opposing sides of the shielding allowance flap.

Referring to FIGS. 6 and 6A, a first protective layer 122 may have a first protective edge portion 124. Similarly, a second protective layer 126 may have a second protective edge portion 128. Referring to FIGS. 7 and 7A, an outboard stitching line 130 may extend in parallel with the first shielding edge 106 at a second distance 132 therefrom. The second distance 132 is preferably less than the first distance 114 so as to ensure that the outboard stitching line does not penetrate the conductive adhesive elements or shielding layers inboard of the inboard stitching line. The outboard stitching line stitchingly secures the first and second protective edge portions (124 and 128) to opposing sides of the shielding allowance flap 116.

Referring to FIG. 8A, in particular implementations of the seal portion 102, the first conductive adhesive element 118 is disposed between the first protective layer 122 and the first shielding layer 104. Similarly, the second conductive adhesive element 120 is disposed between the second protective layer 126 and the second shielding layer 108. The conductive adhesive elements may preferably be comprised of electrically-conductive adhesive tape. Moreover, referring to FIGS. 5 and 5A, the conductive adhesive elements may preferably be laterally centered on the inboard stitching line 112.

Referring to FIGS. 4A, 7A and 8A in certain embodiments of a seal portion 102 the outboard stitching line 130 extends through the protective edge portions (124 and 128), the conductive adhesive elements (118 and 120) and the shielding allowance flap 116.

Referring to FIGS. 4A, 6A, 7A and 8A, a seam portion 102 may further comprise a binding element 134. In such embodiments, the stitching securement of the first and second protective edge portions (124 and 128) to opposing sides of the shielding allowance flap 116 may define a seam flap 136. Moreover, the binding element 134 may wrap around the seam flap 136 from the first protective edge portion 124 to the second protective edge portion 128.

Figure 8:
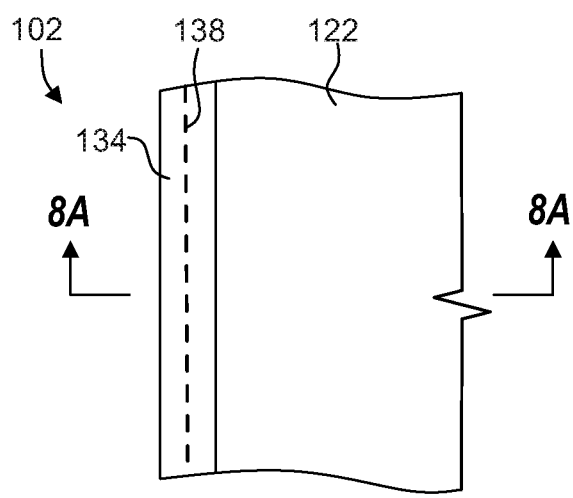
FIG. 8 is a diagrammatic partial view of a completed example seam portion constructed in accordance with the present disclosure, showing a binding stitching line extending through the binding element.
Figure 8A:
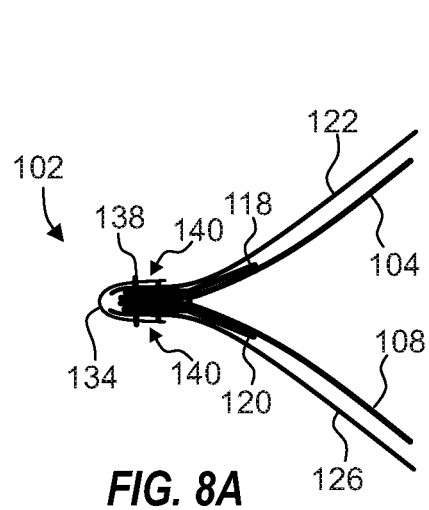
FIG. 8A is a diagrammatic cross-sectional view taken along lines 8A-8A in FIG. 8, showing a binding stitching line extending through the binding element and protective edge portions.
Figure 9:
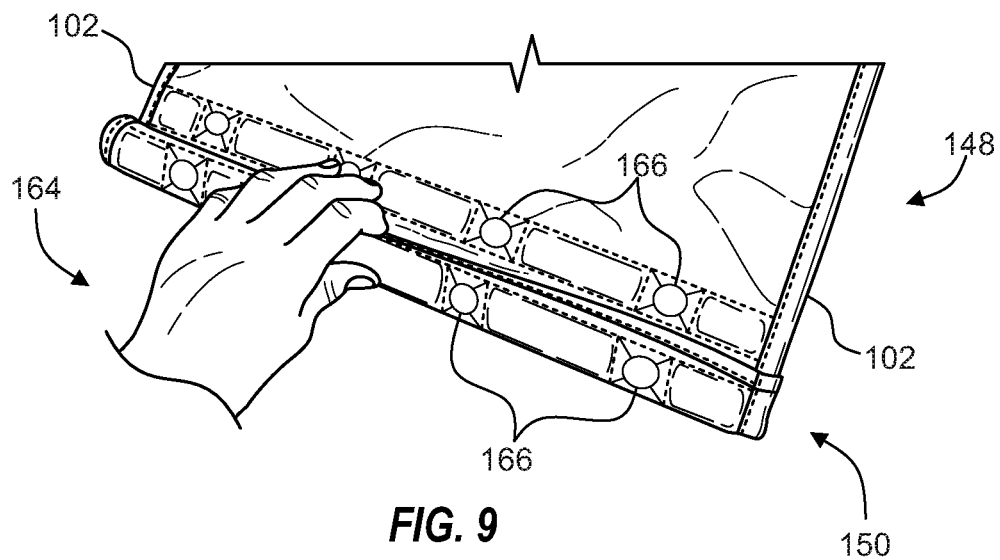
FIG. 9 is a diagrammatic partial perspective view of an example outer mouth portion of a vestibule section, wherein the outer mouth portion is in the form of a magnetic roll closure and is shown being moved toward its closed configuration.
Figure 10:
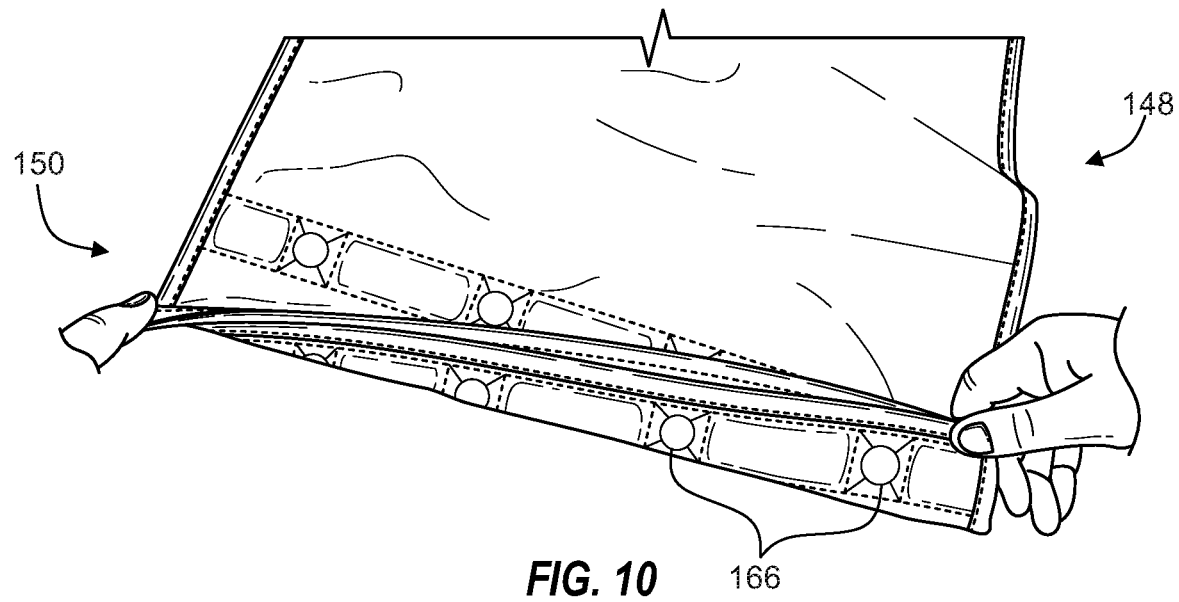
FIG. 10 is a diagrammatic partial perspective view similar to that of FIG. 9, but wherein the outer mouth portion is shown moved further toward its closed configuration.
Figure 11:
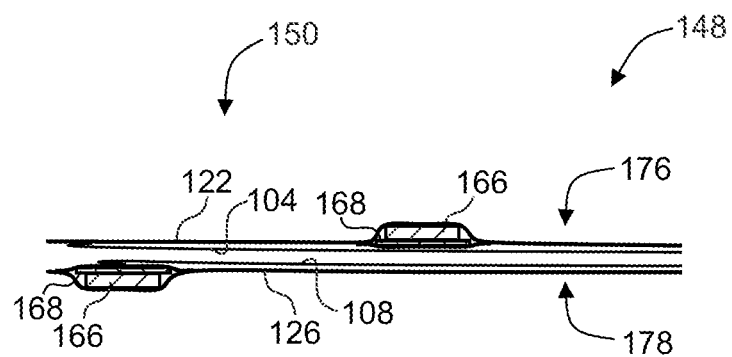
FIG. 11 is a diagrammatic cross-sectional view taken along lines 11-11 in FIG. 2, showing an example magnetic roll style outer mouth portion in its outer open configuration.
Figure 12:
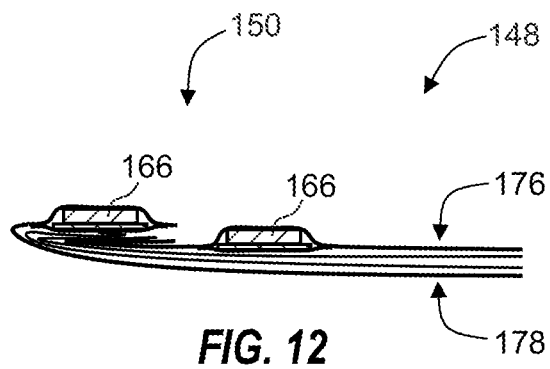
FIG. 12 is a diagrammatic cross-sectional view similar to that of FIG. 11, but wherein the example outer mouth portion in shown in the process of being moved toward its outer closed configuration.
Figure 13:
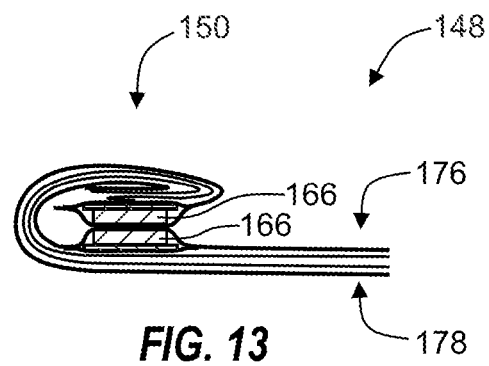
FIG. 13 is a diagrammatic cross-sectional view similar to that of FIG. 12, but wherein the example outer mouth portion in shown in its outer closed configuration.
Figure 14:
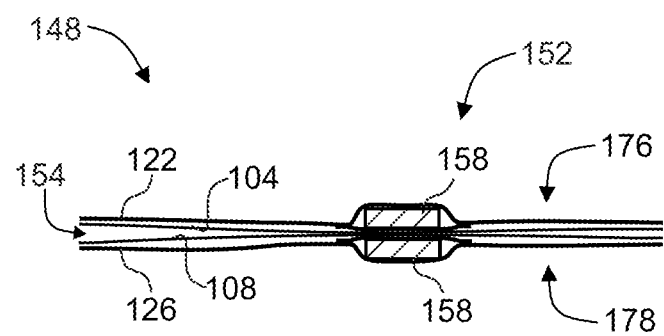
FIG. 14 is a diagrammatic cross-sectional view taken along lines 14-14 in FIG. 2, wherein an example magnetic style inner mouth portion in shown in its inner closed configuration.

Referring to FIGS. 8 and 8A, particular implementations of a seam element 102 may further comprise a binding stitching line 138. In such implementations, the binding element 134 may be comprised of an elongated strip defining a pair of laterally opposed binding edge portions 140. The binding stitching line 138 may extend through the binding edge portions 140 and the protective edge portions (124 and 128). In certain implementations of a seam portion 102, the binding stitching line 138 may also extend through the shielding allowance flap 116. Moreover, the binding stitching line 138 may also extend through the conductive adhesive elements (118 and 120. Any or all of the stitching elements referred to hear in may preferably be comprised of sewn thread, filament, or the like. The protective layers may preferably be comprised of a ballistic nylon material.

In particular preferred embodiments of the Faraday enclosure apparatus 100, the shielding layers may be comprised of multiple shielding sublayers comprising electromagnetic shielding material (e.g., electrically-conductive fabric or foil).

Referring to FIGS. 21-25, a Faraday enclosure apparatus 100 may further comprise a main cavity (a) a main cavity 142 at least partially defined by multiple said seam portions 102. Alternatively, or in addition, with reference to FIG. 23, one or more side wall support elements 144 may be configured to be moved between extended configuration and folded configurations. In such case, the main cavity 142 is supported in a volumetrically open configuration when the side wall support elements 144 are in the extended configuration (see, for example, FIGS. 22 and 23). In contrast, the main cavity 142 is collapsible to a volumetrically closed configuration when the side wall support elements 144 are in the folded configuration (see, for example, FIG. 24).

Figure 35:
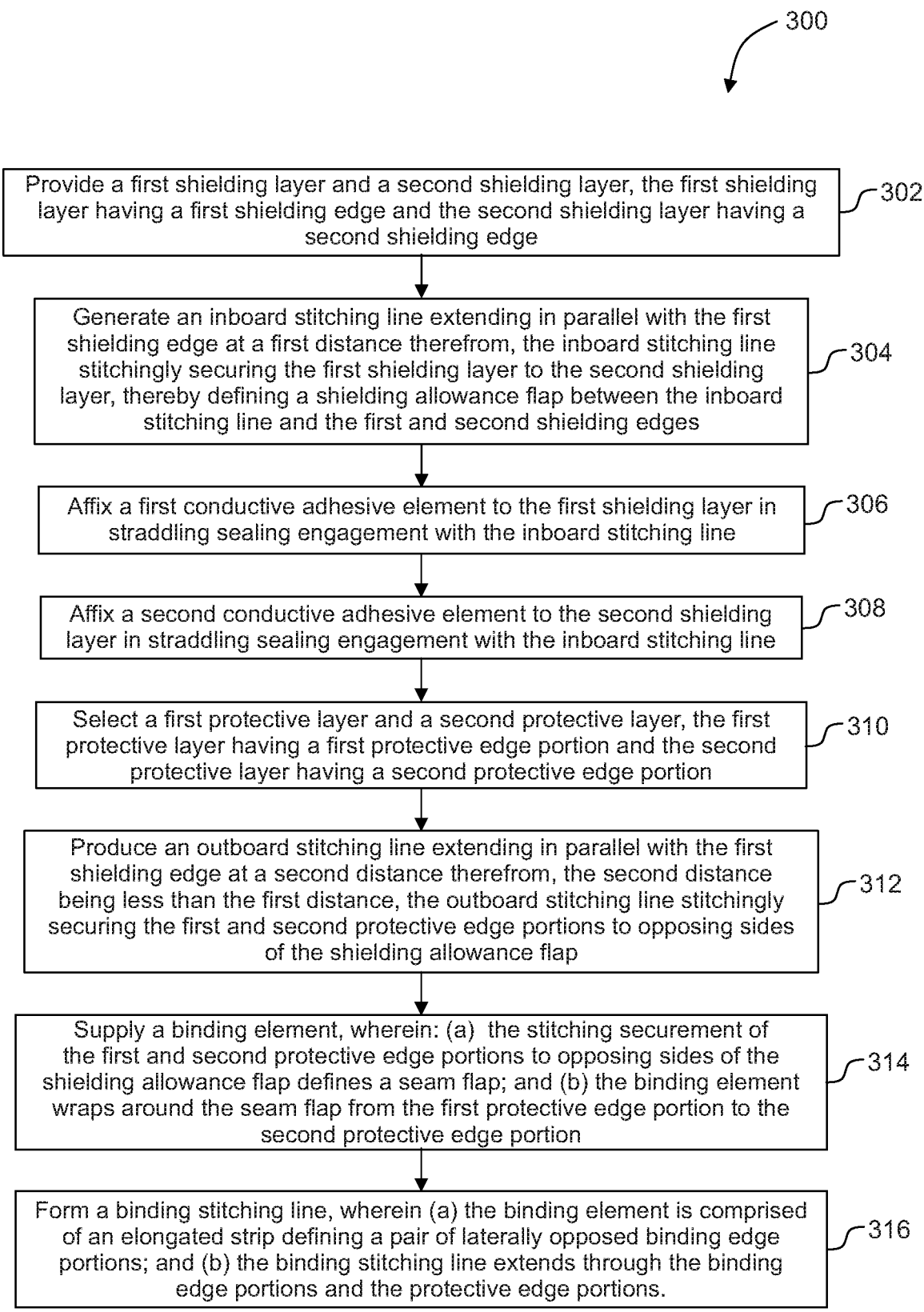
FIG. 35 is a diagrammatic flow chart illustrating a example method of manufacturing a seam portion of a Faraday enclosure apparatus in accordance with the present disclosure.

Referring to FIG. 35, a preferred embodiment of a method of manufacturing a seam portion 102 of a Faraday enclosure apparatus is shown at 300. At block 302, and with further reference to FIG. 3A, a first shielding layer 104 and a second shielding layer 108 are provided. The first shielding layer may have a first shielding edge 106 and the second shielding layer may have a second shielding edge 110. At block 304, and with further reference to FIGS. 4 and 4A, an inboard stitching line 112 extending in parallel with the first shielding edge 106 at a first distance therefrom 114 is generated (for example, by stitching operation). The inboard stitching line 112 stitchingly secures the first shielding layer 104 to the second shielding layer 108, thereby defining a shielding allowance flap 116 between the inboard stitching line 112 and the first and second shielding edges (106 and 110). At block 306, and with further reference to FIGS. 5 and 5A, a first conductive adhesive element is affixed (for example, by adhesion) to the first shielding layer 104 in straddling sealing engagement with the inboard stitching line 112. At block 308, and with further reference to FIGS. 5 and 5A, a second conductive adhesive element 120 is affixed (for example, by adhesion) to the second shielding layer 104 in straddling sealing engagement with the inboard stitching line 112. At block 310, and with further reference to FIGS. 6 and 6A, a first protective layer 122 and a second protective layer 126 are selected. The first protective layer 122 may have a first protective edge portion 124 and the second protective layer 126 may have a second protective edge portion 128. At block 312, and with further reference to FIGS. 7 and 7A, an outboard stitching line 130 extending in parallel with the first shielding edge 106 at a second distance 132 therefrom is produced (for example, by stitching operation). The second distance 132 is preferably less than the first distance 114. The outboard stitching line 130 stitchingly secures the first and second protective edge portions (124 and 128) to opposing sides of the shielding allowance flap 116.

In particular implementations of the method 300, and with further reference to FIGS. 7 and 7A, the first conductive adhesive element 118 is disposed between the first protective layer 122 and the first shielding layer 104, and the second conductive adhesive element 120 is disposed between the second protective layer 126 and the second shielding layer 108. The conductive adhesive elements are preferably comprised of electrically-conductive adhesive tape, and may preferably be laterally centered on the inboard stitching line 112. The outboard stitching line 130 may preferably extend through the protective edge portions (124 and 128), the conductive adhesive elements (118 and 120) and the shielding allowance flap 116.

In particular implementations of the method 300, at block 314 and with further reference to FIGS. 8 and 8A, a binding element 134 may be supplied. In such implementations, the stitching securement of the first and second protective edge portions (124 and 128) to opposing sides of the shielding allowance flap 116 may define a seam flap 136 (see FIG. 7A). Moreover, the binding element 13 may wrap around the seam flap 136 from the first protective edge portion 124 to the second protective edge portion 128.

In certain implementations of the method 300, at block 316 and with further reference to FIGS. 8 and 8A, a binding stitching line 138 may be formed (for example, by stitching operation). In such implementations, the binding element 134 may be comprised of an elongated strip defining a pair of laterally opposed binding edge portions 140.

Referring to FIGS. 8 and 8A, the binding stitching line 138 may extend through the binding edge portions 140 and the protective edge portions (124 and 128). In addition, the binding stitching line 138 may further extend through the shielding allowance flap 116. Moreover, the binding stitching line 138 may further extend through the conductive adhesive elements 118 and 120.

In certain implementations of the method 300, a main cavity 142 within the Faraday enclosure apparatus 100, may be at least partially defined by multiple said seam portions 102.

Figure 2:
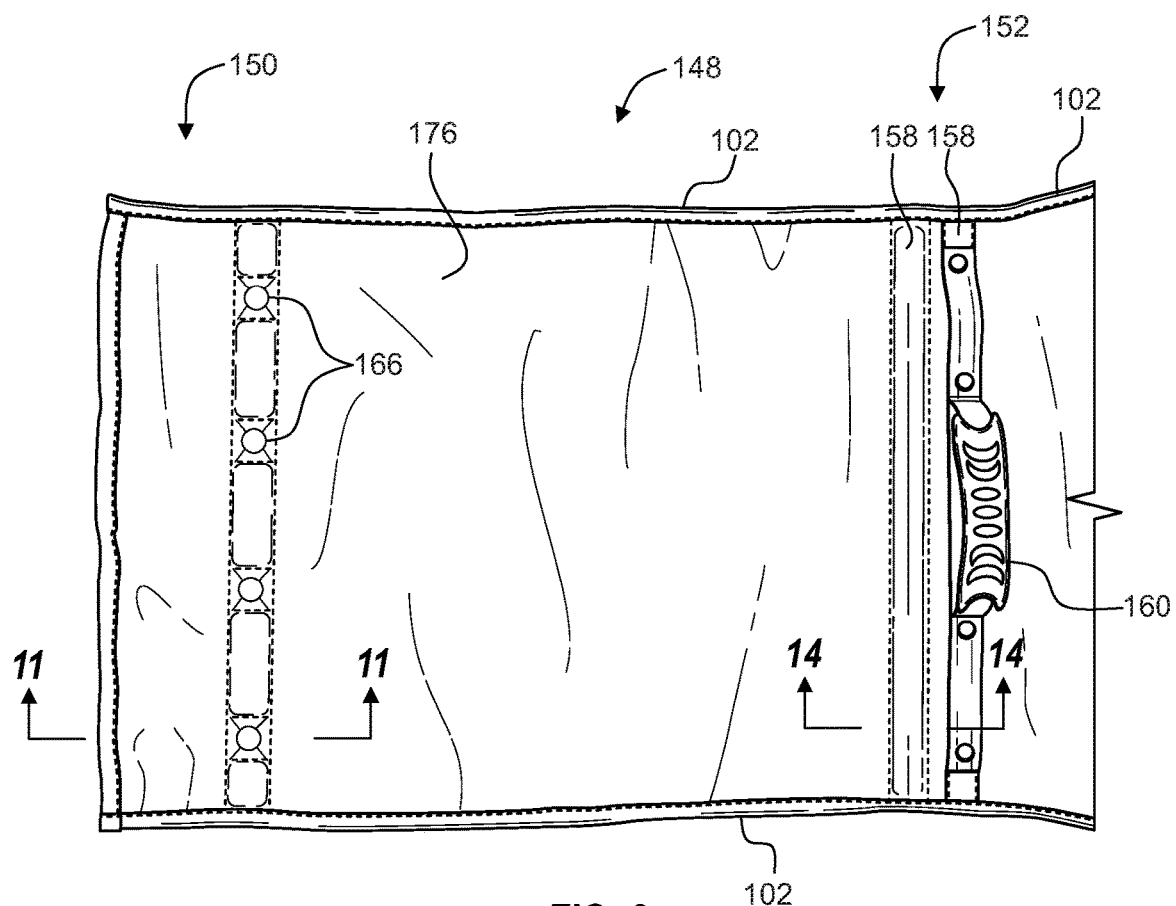
FIG. 2 is a diagrammatic partial plan view a vestibule section of an example Faraday enclosure apparatus in accordance with the present disclosure.
Figure 15:
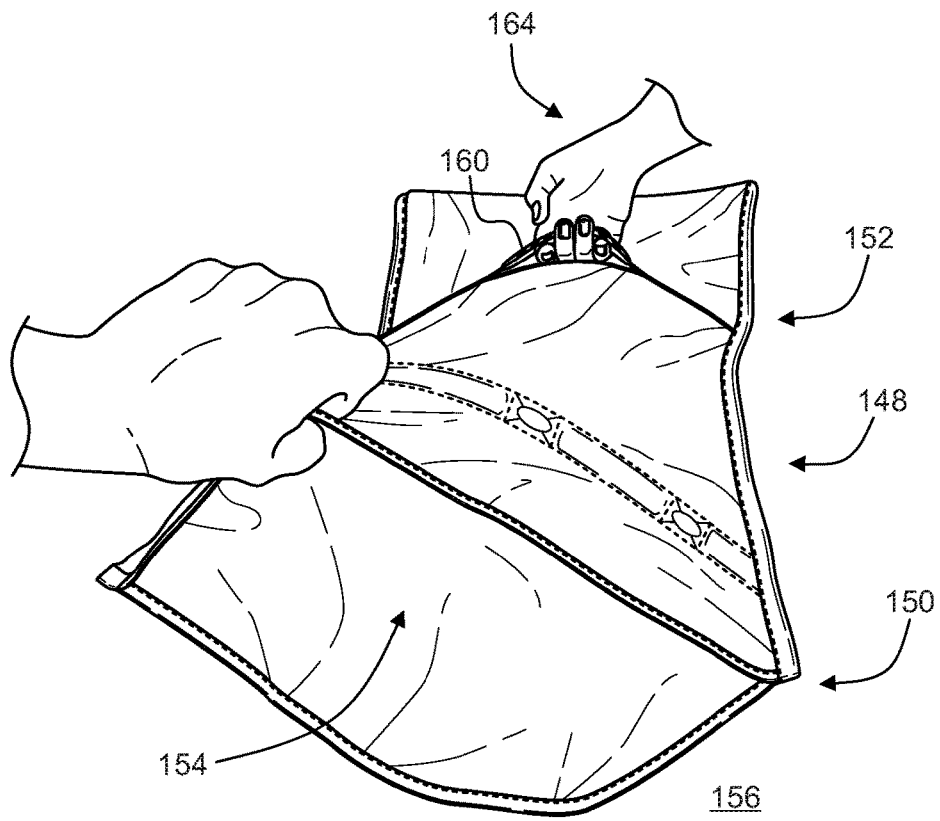
FIG. 15 is a diagrammatic perspective view of the example Faraday enclosure apparatus of FIG. 1, shown with the outer and inner mouth portions of the vestibule section in their respective open configurations, thereby placing the main cavity of the Faraday enclosure in spatial and electromagnetic-signal communications with the ambient environment.
Figure 18:
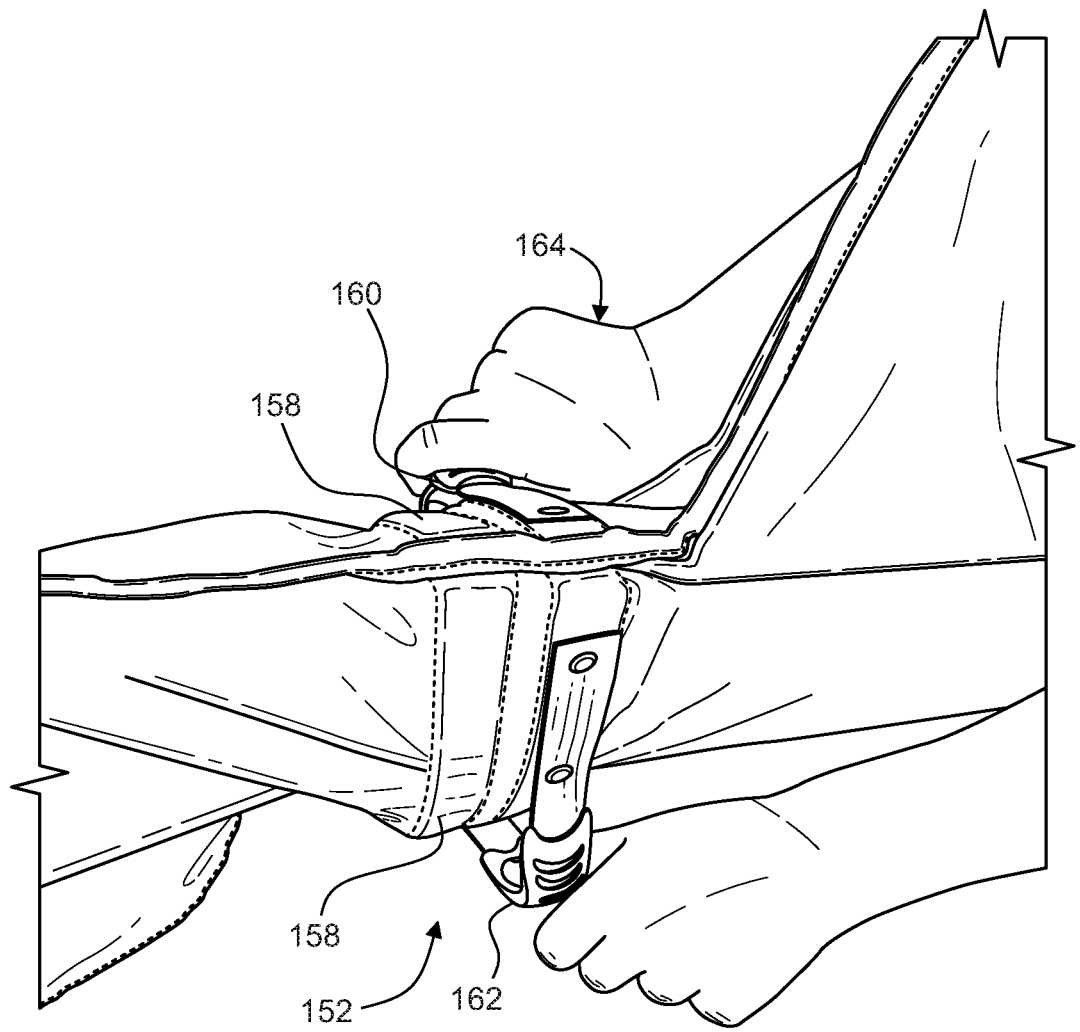
FIG. 18 is a diagrammatic partial perspective view of an example inner mouth portion, showing the actuation grips being pulled apart from one another by a user to overcome the magnetic bias and actuate the inner mouth portion to the inner open configuration.
Figure 19:
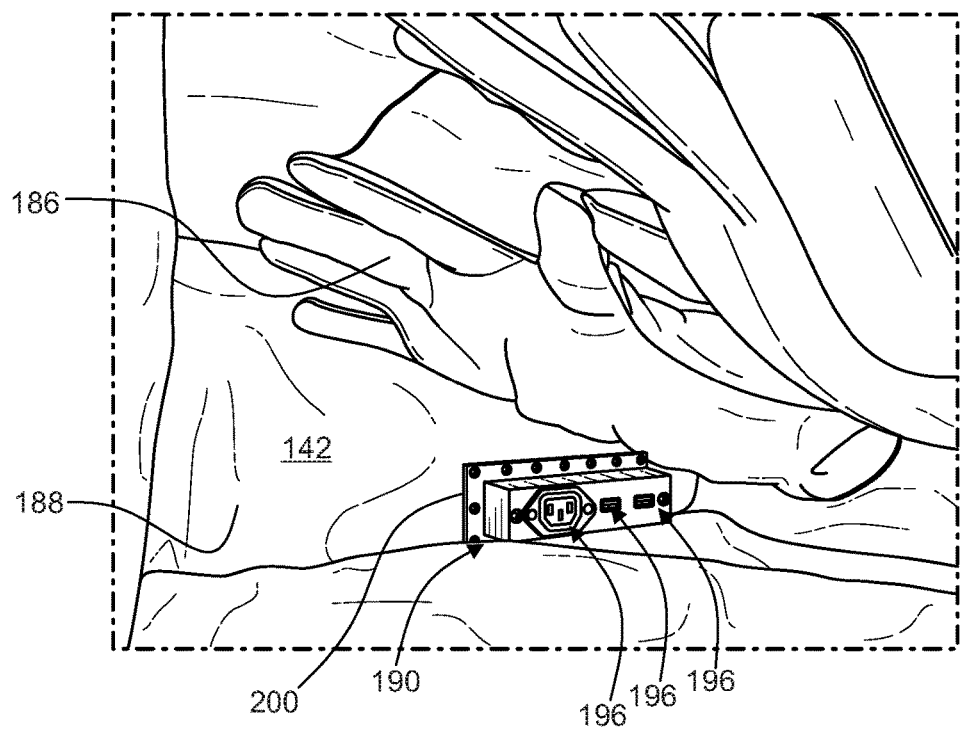
FIG. 19 is a diagrammatic partial perspective view of an example main cavity, showing a conductive shielded glove extending into the cavity as well as an example electromagnetic filter element extending through a wall of the Faraday enclosure apparatus.
Figure 20:
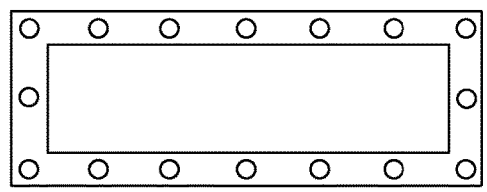
FIG. 20 is a diagrammatic plan view of example outboard clamping ring for use in mounting certain electromagnetic filter elements through a wall of the Faraday enclosure apparatus.
Figure 21:
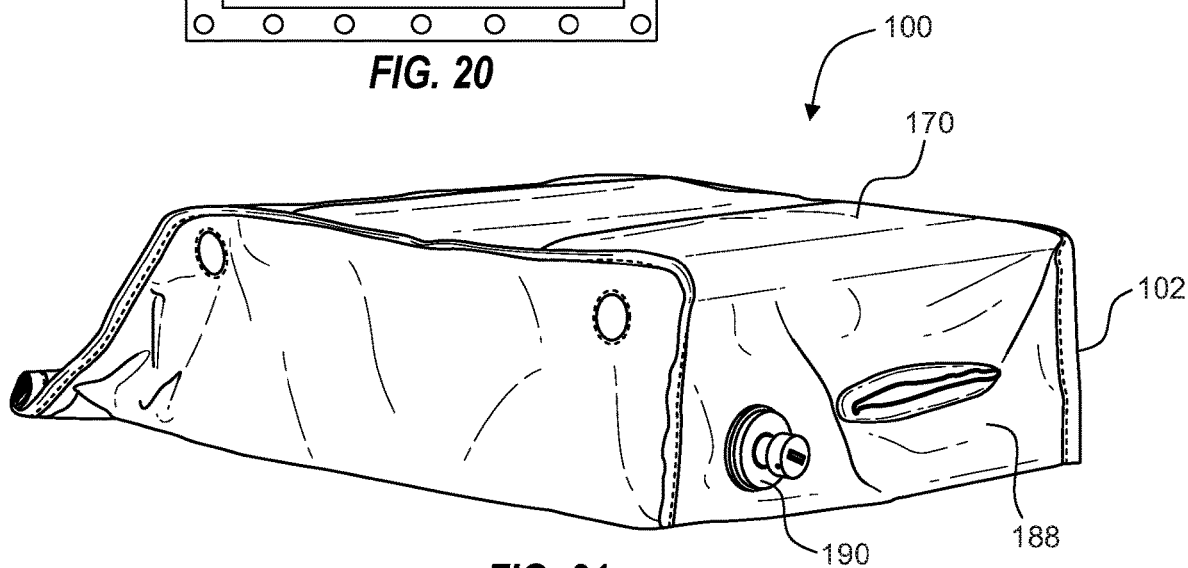
FIG. 21 is a diagrammatic perspective view of an alternate example of a Faraday enclosure apparatus in accordance with the present disclosure, showing another example electromagnetic filter element extending through a wall of the Faraday enclosure apparatus and into the main cavity.
Figure 22:
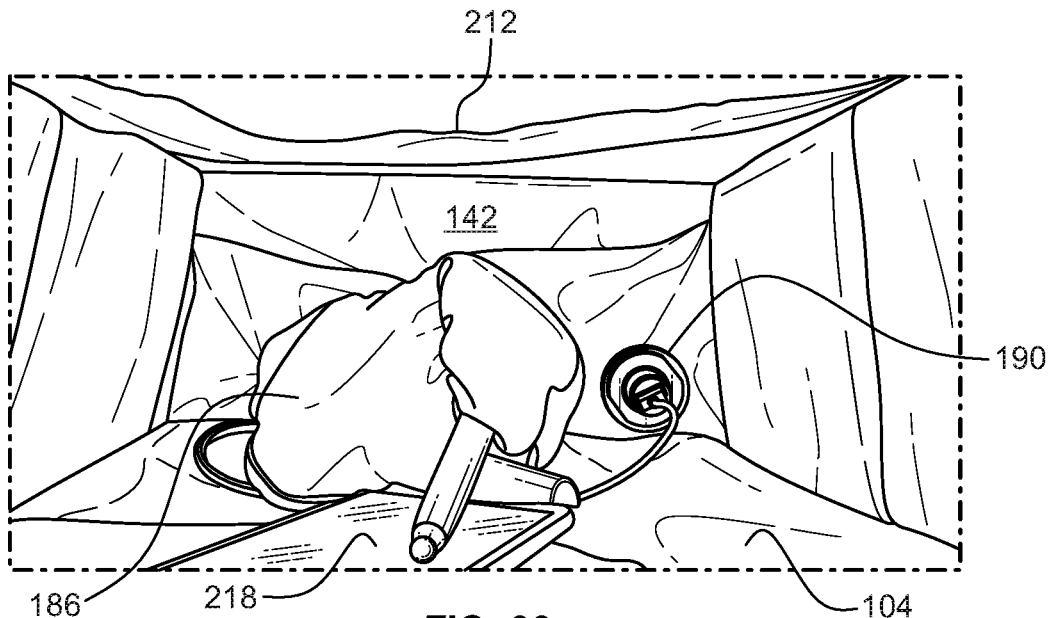
FIG. 22 is a diagrammatic partial view of the main cavity of an alternate example of a Faraday enclosure apparatus in accordance with the present disclosure, wherein the enclosure is expandable and collapsible by way of sidewall support elements movable between extended and folded configurations.

Referring to FIGS. 1 and 19, certain implementations of a Faraday enclosure apparatus 100 may comprise a main section 146 and a vestibule section 148. The main section 146 may define a main cavity 142 therein. Referring to FIGS. 2 and 15, the vestibule section 148 may have an outer mouth portion 150, an inner mouth portion 152 and a vestibule cavity 154 defined therebetween. Referring to FIGS. 9-13, The outer mouth portion 150 may be configured for movement between an outer open configuration and an outer closed configuration. Referring to FIGS. 2, 14, and 16-18, the inner mouth portion 152 may be configured for actuation between an inner open configuration and an inner closed configuration. When the outer mouth portion 150 is in the outer open configuration (see, for example, FIGS. 11 and 15), the vestibule cavity 154 is in spatial and electromagnetic-signal-exposed communication with an ambient environment 156 external to the Faraday enclosure apparatus 100. Spatial communication is defined herein as the ability for solid objects to be moved between the respective locations (e.g., cavities and/or ambient environment). When the outer mouth portion 150 is in the outer closed configuration (see, for example, FIG. 13), the vestibule cavity 154 and the main cavity 142 are sealed from spatial and electromagnetic-signal communication with the ambient environment 156. When the inner mouth portion 152 is in the inner open configuration (see, for example, FIGS. 15 and 18), the vestibule cavity 154 is in spatial and electromagnetic-signal-exposed communication with the main cavity 142. When the inner mouth portion 152 is in the inner closed configuration (see, for example, FIGS. 14, 16 and 17), the vestibule cavity 154 is sealed from spatial and electromagnetic-signal communication with the main cavity 142 and the main cavity 142 is sealed from spatial and electromagnetic-signal communication with the ambient environment 156. Referring to FIGS. 14 and 16-18, the inner mouth portion 152 may include a pair of opposing inner seal elements 158 (e.g., magnetic seal elements). The inner magnetic seal elements 158 may be magnetically biased to attract one another for actuating the inner mouth portion 152 to the inner closed configuration.

Referring to FIGS. 1, 2 and 16-18, a Faraday enclosure apparatus 100 may further comprise a first actuation grip 160 and a second actuation grip 162. The actuation grips may preferably be mounted to (e.g., by rivet operation or the like) and extending from outer surfaces of the vestibule section 148. Additionally, the actuation grips may be disposed on opposing sides of the inner mouth portion 152. Moreover, referring to FIG. 18, the actuation grips (160 and 162) may be configured to be pulled apart from one another by a user 164 to overcome the magnetic bias and thereby actuating the inner mouth portion 152 to the inner open configuration.

Referring to FIGS. 1, 2, and 16-18, the inner mouth portion 152 may include two pairs of opposing inner magnetic seal elements 158. One said pair may be arranged in parallel to the other. The inner magnetic seal elements 158 may be, for example, unitary magnetic strips sewn into the Faraday enclosure apparatus or may be formed of a plurality of magnets 166 and a stiffener backing strip 168 sewn into the Faraday enclosure apparatus 100 (e.g., similar to what is shown in one of the instances in FIG. 11).

Referring to FIG. 1, in particular implementations of a Faraday enclosure apparatus 100, the main section 146 includes an upper wall 170, a lower wall 172 opposite of the upper wall, and a vestibule interface wall 174 extending from the upper wall toward the lower wall. The vestibule section 148 may include include an upper vestibule panel 176 and a lower vestibule panel 178 opposite of the upper vestibule panel. The Faraday enclosure apparatus 100 may have a deployed configuration (shown for example in FIG. 1) in which the upper and lower vestibule panels (176 and 178) are generally flat-planar and adjacent to one another, and the upper wall 170 and lower wall 172 are spaced apart from one another at a main cavity height 180. In such implementations, in the deployed configuration, the vestibule interface wall 174 may extend at a vestibule interface angle 182 of 90-150 angular degrees with respect to the upper vestibule panel 178. In certain implementations, the vestibule interface angle may preferably be between 120 and 150 degrees. Alternatively, or in addition, the lower vestibule panel 178, lower wall 172, upper wall 170, vestibule interface wall 174 and upper vestibule panel 176 may be comprised of a unitary piece of shielding material and a unitary piece of protective fabric. The main section 146 may include a front wall 184 extending from the upper wall 170 to the lower wall 172, wherein the front wall 184 has one or more shielded gloves attached thereto and extending into the main cavity 142.

Figure 28:
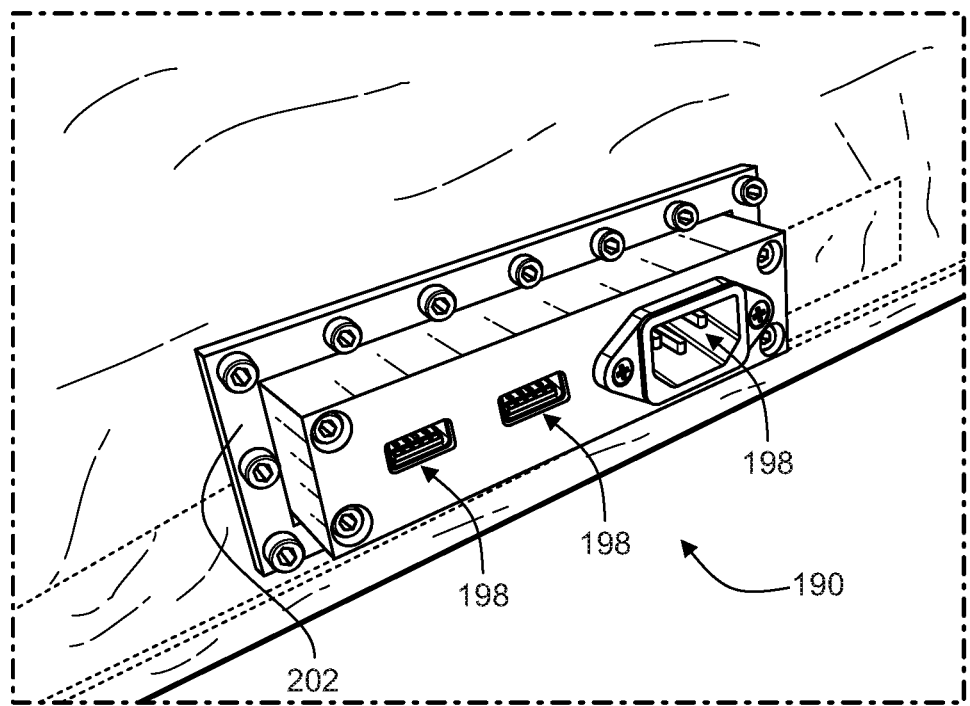
FIG. 28 is a diagrammatic partial perspective view of an example electromagnetic filter element mounted through a wall of a Faraday enclosure in accordance with the present disclosure.
Figure 29:
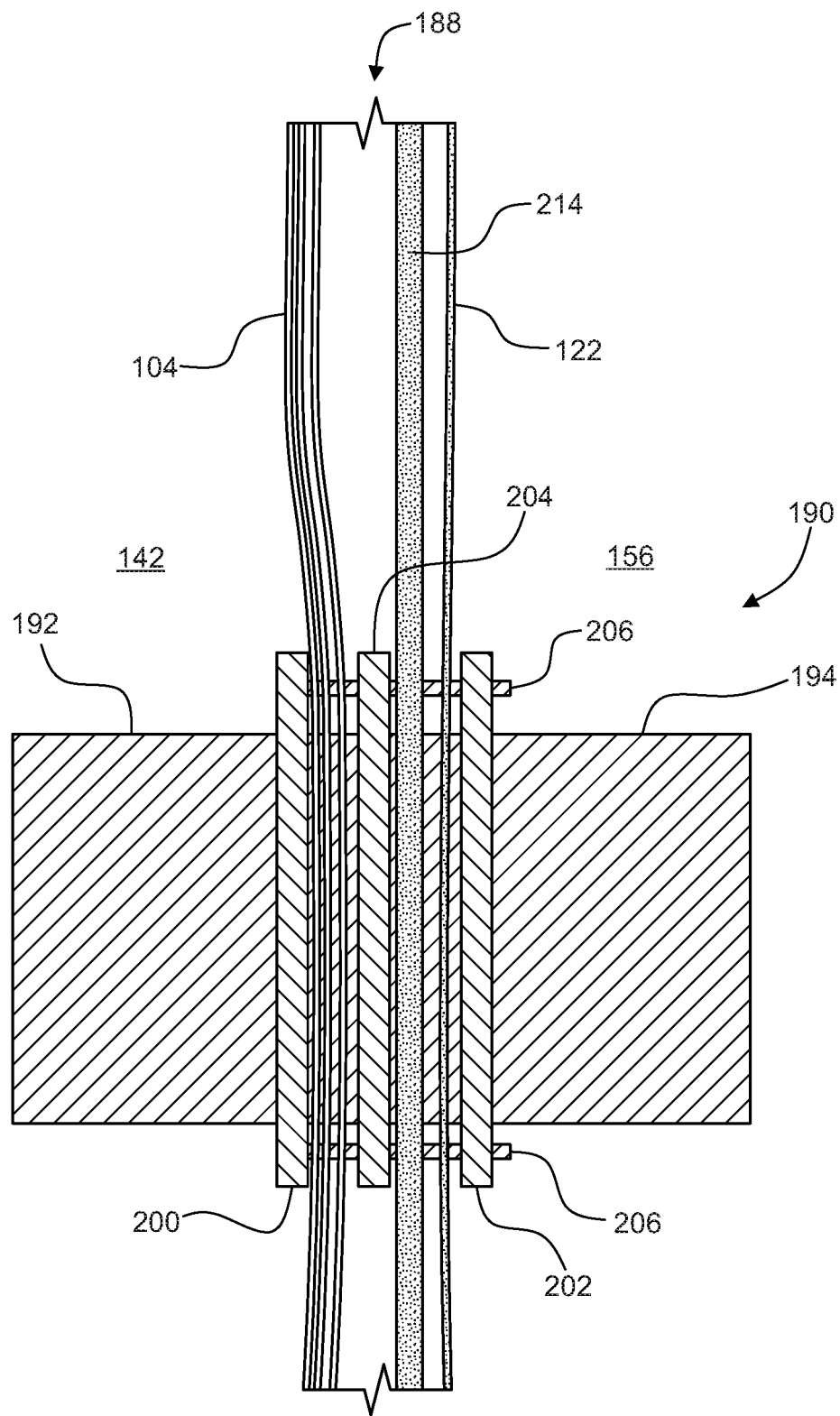
FIG. 29 is a diagrammatic cross-sectional view of an example electromagnetic filter element mounted through a wall of a Faraday enclosure in accordance with the present disclosure.

Referring to FIGS. 19-22 and 28-29, a Faraday enclosure apparatus may comprise a main cavity 142 at least partially defined by an enclosure wall 188 and configured to be electromagnetically shielded from an ambient environment 156 external to the Faraday enclosure apparatus 100. The enclosure wall 188 may include a shielding layer 104 and a protective layer 122. The shielding layer 104 may be comprised of electromagnetic shielding material. An electromagnetic filter element 190 may include an inboard segment 192 and an outboard segment 194. An inboard connector 196 is disposed in the inboard segment 192. An outboard connector 198 is disposed in the outboard segment 194. The inboard and outboard connectors are in filtered electrical communication with one another. Referring to FIG. 29, In particular implementations, an inboard clamping ring 200 and an outboard clamping ring 202 may be provided. The inboard segment 192 may extend through the shielding layer 104 and the inboard clamping ring 200, and into the main cavity 142. The outboard segment 194 may extend through the protective layer 122 and the outboard clamping ring 202, and into the ambient environment 156. The inboard and outboard clamping rings may be clampingly fastened to one another with the shielding layer 104 and protective layer 122 secured therebetween.

Referring to FIG. 29, in particular implementations of a Faraday enclosure apparatus 100 with an electromagnetic filter element 190, the electromagnetic filter element 190 may include a flange portion 204 disposed between the inboard and outboard segments (192 and 194). The flange portion 204 may be disposed between the shielding layer 104 and the protective layer 122, and preferably in electrically-conductive communication with the shielding layer 104. The clampingly fastening may be by way of one or more threaded fastener elements 206 extending, for example, through the outboard clamping ring 202 and the flange portion 204, and into threaded engagement with the inboard clamping ring 200 or associated threaded nuts. A stiffening wall layer 214 may be included to provide rigidity to the area at which the filter 190 is mounted to the wall 188.

In particular implementations of the Faraday enclosure apparatus 100, the filtered electrical communication employs one or more filters selected from the group consisting of an AC-DC power filter, an RFI filter, and an EMI filter. The outboard and inboard connectors may be, for example, USB jacks or AC power jacks.

While various embodiments of the present invention have been disclosed and described in detail herein, it will be apparent to those skilled in the art that various changes may be made to the configuration, operation and form of the invention without departing from the spirit and scope thereof. In particular, it is noted that the respective features of embodiments of the invention, even those disclosed solely in combination with other features of embodiments of the invention, may be combined in any configuration excepting those readily apparent to the person skilled in the art as nonsensical. Likewise, use of the singular and plural is solely for the sake of illustration and is not to be interpreted as limiting.

Preferred embodiments of the Faraday enclosures disclosed herein may be built with law enforcement and military digital forensics investigators in mind. As a continuously evolving field where the success of an investigation may be dependent on the availability of certain tools, digital forensics investigations now require high-level RF shielding, vestibule-style openings, device connectivity, device operability, and enclosure portability in one unit, all at a low price point. The shielded enclosures disclosed herein are capable of hitting these marks, making them extremely useful tools for law enforcement and military investigators as well as any other user with the same kind of requirements.

Certain preferred embodiments of the shielded enclosures disclosed herein may allow investigators to isolate devices such as cell phones and tablets (but any other device as well) from RF signals such as WiFi and cell signals, operate the device through shielded gloves, view the device through a shielded transparent window, extract information from the device through shielded data ports, and keep multiple devices powered through shielded power ports. The enclosure may include a vestibule-style opening to allow new devices to be introduced into the enclosure or to leave the enclosure, without exposing the main cavity of the enclosure to RF signals.

Certain preferred embodiments of an RF/EMI shielded enclosure 100 in accordance with the present disclosure allow for device manipulation and EMI filtered data/power operation in a desktop-size configuration, while allowing introduction or exit of devices through the enclosure without exposing the main cavity of the enclosure to RF signals. The preferred embodiments may include a semi-soft construction consisting of conductive fabric and other materials, conductive adhesive to seal the seams, a magnetic vestibule-style opening, an enclosure shape that ends in a "teardrop tip" to effectively attach to the vestibule-style opening, a data and power RF/EMI filter module that breaches the fabric, hand pockets sewn or attached to the sides, and a transparent conductive fabric window 212 for viewing devices inside of the enclosure. Features of a particular preferred embodiment of a shielding enclosure in accordance with the present disclosure are shown herein. However, alternate embodiments of a shielding enclosure 100 may be constructed with fewer or more features than those shown and described below.

Referring to FIG. 1, embodiments of the enclosure 100 may include semi-soft walls with conductive fabric, hand pockets sewn into the walls of the enclosure, a "teardrop tip" end of the enclosure which may connect to a magnetic vestibule-style opening, and a transparent conductive fabric viewing window 212 on the top of the enclosure.

Referring to FIG. 2, certain preferred embodiments of the enclosure 100 may include a vestibule-style opening. This opening may be somewhat flat, a feature that allows the seals, or "mouths" on either end of the vestibule to function simply, effectively, and with minimal product cost. Because it is largely flat, this type of opening may be different than a conventional door-type opening. The vestibule-style opening may consist of an "outer mouth" RF tight seal (left side of FIG. 2) as well as an "inner mouth" RF tight seal, separated by a shielded section into which an object is passed from one side to the other. This vestibule allows one mouth of the enclosure to be opened while the other mouth remains closed, so RF signals are continuously blocked from passing completely through. This feature may be useful for investigators, evidence handlers, or anyone else who would like devices in the enclosure to remain shielded while adding or removing other devices from the enclosure.

In other embodiments of the enclosure 100, the opening may be not as flat, may include a different orientation of mouths, or may not necessarily use magnets. For example, the opening may look more like a tube or a rectangular box, with cinch ties, conductive hook-and-loop fastener material, or another material as the method of closure. The mouths may be positioned differently, such as below, above, under, perpendicular, or any other orientation.

In other embodiments the vestibule may remain separate from the rest of the enclosure, such as if it were a bolt-on module that could attach to the side of a rigid RF enclosure, or any other enclosure. As it offers valuable functionality, the vestibule-style opening may be desirable for any RF enclosure, large or small, rigid or soft, expandable or stationary. In some implementations, the vestibule-style opening may be sold or produced separately from the rest of the enclosure discussed herein, making it a particular focus of this disclosure.

Referring to FIGS. 9-13, in certain preferred embodiments of the shielded enclosures 100, the outer mouth of the vestibule may include a magnetic roll closure, whereby the user would roll the end of the vestibule over to connect a set of magnets, parallel to the outer edge, to another set of magnets on the opposing side, a little further away from the edge and also parallel to the outer edge. The roll of the end may be held together tightly by the connection of the magnets. The magnets may be backed by strips of thicker material such as plastic, to push down evenly on the conductive fabric and produce a tight connection. These "magnets" may be individual, such as 4 separate magnets in parallel, or may comprise a magnetic strip such as magnetic adhesive.

In other embodiments of the enclosure 100, the outer mouth may not be a roll-style, but instead like the inner mouth, which may include magnets in the same position on opposing sides of the vestibule to "pinch" the mouth closed. It may also include a different method of closure, such as conductive hook and loop, regular hook and loop, cinch strap, or any other material and method of closure.

Figure 16:
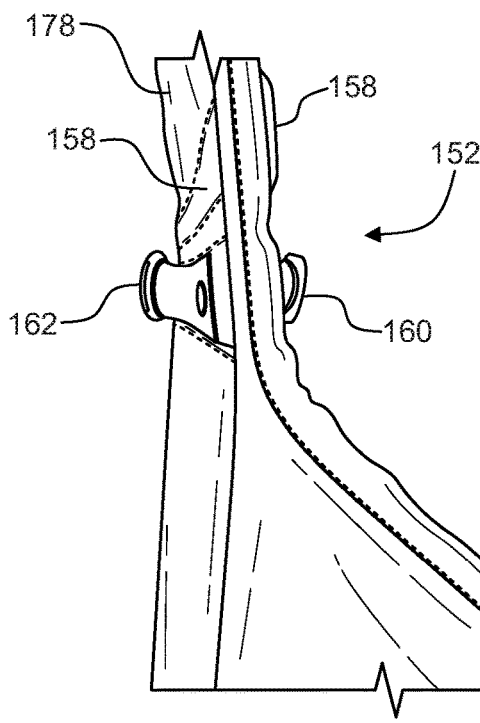
FIG. 16 is a diagrammatic partial side view of the example Faraday enclosure apparatus of FIG. 1, showing details of the inner mouth portion and associated actuation grips.
Figure 17:
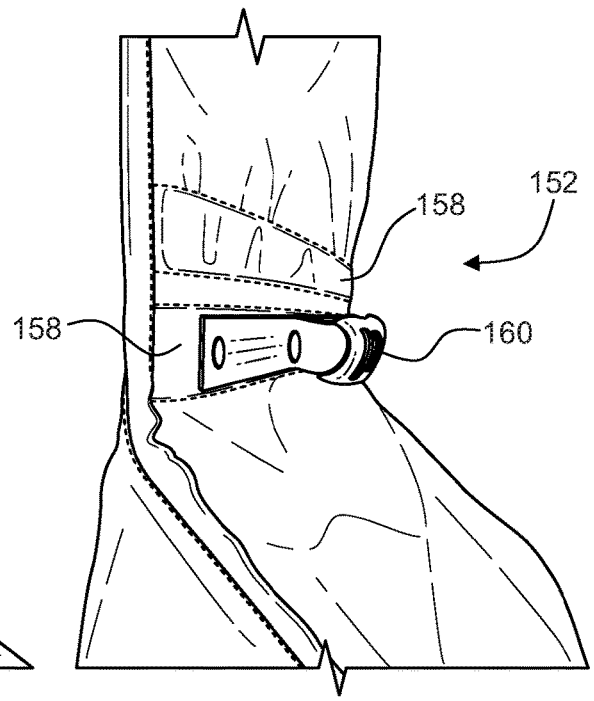
FIG. 17 is a diagrammatic partial perspective view of the details in FIG. 16 from another viewing angle, showing two cooperating pairs of inner seal elements, one of which is disposed in alignment with the actuation grips.

Referring to FIGS. 15-17, the inner mouth of the preferred embodiments of the shielded enclosures may be composed of magnets in the same position on opposing sides of the vestibule, which pinch the conductive fabric together, forming a tight RF seal. The magnets may be in a line parallel to the outer mouth edge of the vestibule, and there may be multiple lines of magnets. In the preferred embodiments, two lines of magnets are shown on each side of the vestibule. One line on each side may correspond to an opposing line of magnets on the other side, forming a single seal. The other line of magnets and corresponding opposing line may act as another separate seal, thus forming two completely separate RF seals in the inner mouth portion of the vestibule. This may provide extra assurance that signal cannot pass from the vestibule to the main cavity of the enclosure, in the case that one seal does not "seat" correctly on its opposing side of magnets and the other seal is required for "backup." Each line of magnets may be backed by strips of thicker material such as plastic, to push down evenly on the conductive fabric and produce as tight of a seal as possible. Handles may be placed on opposing sides of the vestibule to allow the user to pull the mouth apart.

In alternate embodiments of the enclosure 100, different types of materials may be used for the inner mouth, such as conductive hook and loop, zippers, regular hook and loop, cinch straps, or any other material that may be used to create an RF seal. In alternate embodiments, it may be possible to only use one RF seal in the inner mouth (as opposed to two seals like in the preferred embodiment), but it may also be possible to use three or more RF seals. Each of the seals may not be backed by a material like plastic in other embodiments, but instead may be purely fabric, or just magnets, or any other material.

Referring to FIG. 18, the inner mouth of certain preferred embodiments of the shielded enclosures 100 may be pulled apart by handles to allow passage of a device from the vestibule into the main cavity or from the main cavity into the vestibule. One side of the inner mouth may be attached to a table or other fixed object to allow a user to simply pull up on the handle to open the inner mouth. In other embodiments the inner mouth may open by different means, such as a mechanical opener, a push lever, a cantilever mechanism, or any other means which may be used to apply force. In other embodiments, the inner mouth may be closed by a separate outside object that may not be physically attached to the enclosure, such as a large "chip clip" type object.

Referring to FIG. 1, in particular preferred embodiments of the shielded enclosure 100, the vestibule may connect to the main cavity near the inner mouth opening. The main cavity may end in a shape similar to the tip of a teardrop and connect with the vestibule at that point. This may allow the main cavity of the enclosure to be primarily box-like, while still allowing it to connect to the vestibule, which may be substantially flat. A particular advantage of this "teardrop tip" like connection point may be that it can expand vertically to allow thicker objects to pass inward. Although the main type of device used with this enclosure could be phones, tablets, and other flat devices, other various objects such as multi-charge phone docks might be useful to place inside as well. If the vestibule were simply flat with a rigid slot-like connection point to the main cavity, there could be no way to allow thicker objects to enter the enclosure. Therefore this "teardrop tip" connection point may be a particularly novel feature disclosed in the preferred embodiments, Referring to FIG. 19, the main cavity 142 of certain preferred embodiments of the shielded enclosures 100 may appear "box-like" while still using conductive fabric as the primary means of shielding RF signals. Other embodiments of the shielded enclosures may not use conductive fabric, but instead metal or other materials that shield RF signals. Additionally, a combination of metal and fabric may be used, for example if the gloves or transparent window were to include a metal frame to allow for modularity, higher shielding, ease of manufacture, cost savings, and other reasons. In particular preferred embodiments, there may be two hand pockets that allow an operator to manipulate objects inside of the enclosure. It may be particularly valuable in the preferred embodiments to connect and disconnect devices to/from power or data transfer, to pass them from the main cavity to the vestibule, to hold them up to the transparent window for viewing or photographing, and to perform other functions. The hand pockets may allow the user to open the vestibule inside of the main cavity and pass devices through. In alternate embodiments there may only be one hand pocket, or no hand pockets at all. The hand pockets may be sewn into the sides of the enclosure, or may attach with a rigid metal plate that may allow the hand pockets to be easily replaceable (see, for example, FIGS. 30-32). The hand pockets may include single or double layer conductive material.

The main cavity of certain preferred embodiments of an enclosure 100 may also include an RF/EMI filter which holds connections from outside of the cavity to inside (such as AC power and USB). This filter may be mounted through the enclosure. In other embodiments, the filter unit may connect to the main cavity via an outer "tube-like" structure, or by any other means which may secure it in place, or even not secure it yet leave it free floating. In other embodiments there may not be a filter unit at all.

In particular preferred embodiments of the shielded enclosure 100 there may be a transparent window 212 at the top of the main cavity, which may allow the user to see and manipulate devices inside, take photos of device screens, etc. The transparent window may include a metal frame to keep it flat and "non-wavy." This metal frame may form the connection point between the transparent conductive fabric and the non-transparent conductive fabric. Both types of fabric, or other fabric, may be overlapped inside of the frame and the parts of the frame may be compressed with screws. In alternate embodiments there may not be a metal frame, and there may not even be a transparent window at all. In alternate embodiments there may be different combinations of objects inside of the main cavity, for example there may be RF dampening foam on the bottom and/or walls, or there may be a power strip attached to the side.

Figure 23:
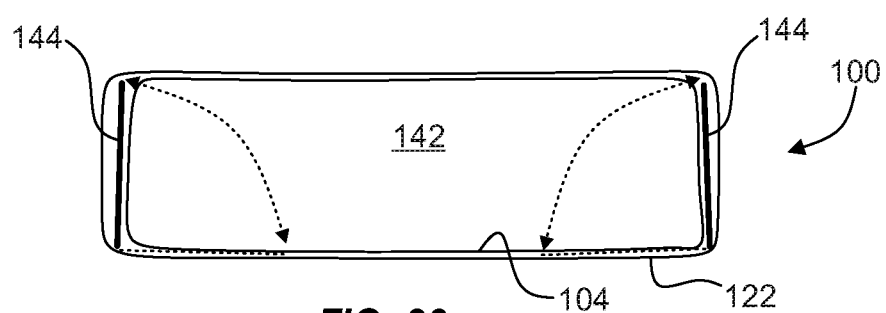
FIG. 23 is a diagrammatic cross-sectional view a Faraday enclosure apparatus similar to that of FIG. 22, wherein the sidewall support elements are shown movable between extended and folded configurations.
Figure 24:
FIG. 24 is a diagrammatic side view a Faraday enclosure apparatus similar to that of FIG. 22, illustrating the collapsibility of the enclosure when the sidewall support elements are in the folded configuration.
Figure 25:
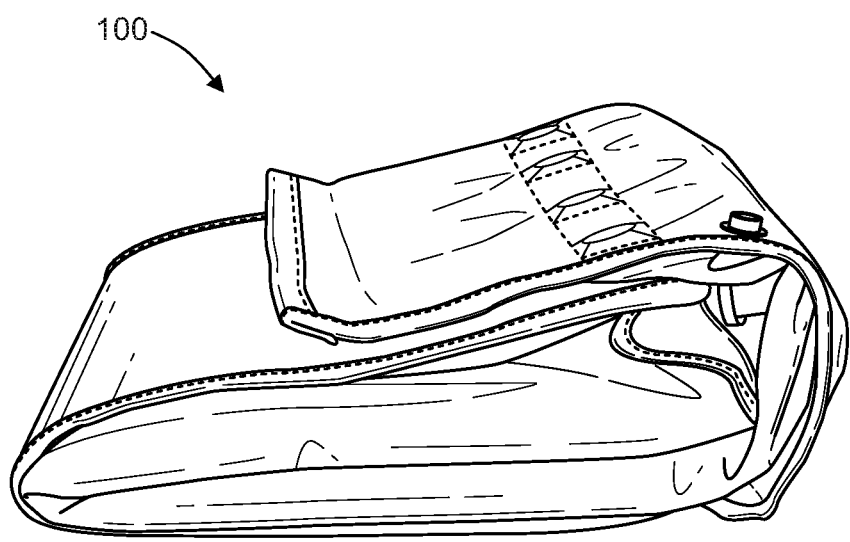
FIG. 25 is a diagrammatic side view a Faraday enclosure apparatus of FIG. 24 of FIG. 22, but wherein the collapsed enclosure is folded for efficient storage and transport, with or without electronic devices retained therein.

Referring to FIGS. 23-25, in certain embodiments, the sides of the enclosure 100 may not stay rigid, but instead may collapse for portability/storage. For example, the enclosure 100 may include one, two, or more sidewalls 144 that are attached to the enclosure in such a way that they can support the enclosure and allow it to maintain a box-like shape when extended, but may fold downward and/or inward to allow the enclosure to collapse. The sidewalls may also be creased or cut in such a way that the enclosure may be folded over on itself to further decrease its size. This special method of folding may be desirable for allowing the enclosure to be used in both the lab and the field, and may not be seen in such a way in the prior art. Achieving this type of main cavity interior space while still allowing high portability may certainly be an integral aspect of the alternate and even preferred embodiments of the shielded enclosures.

Figure 26:
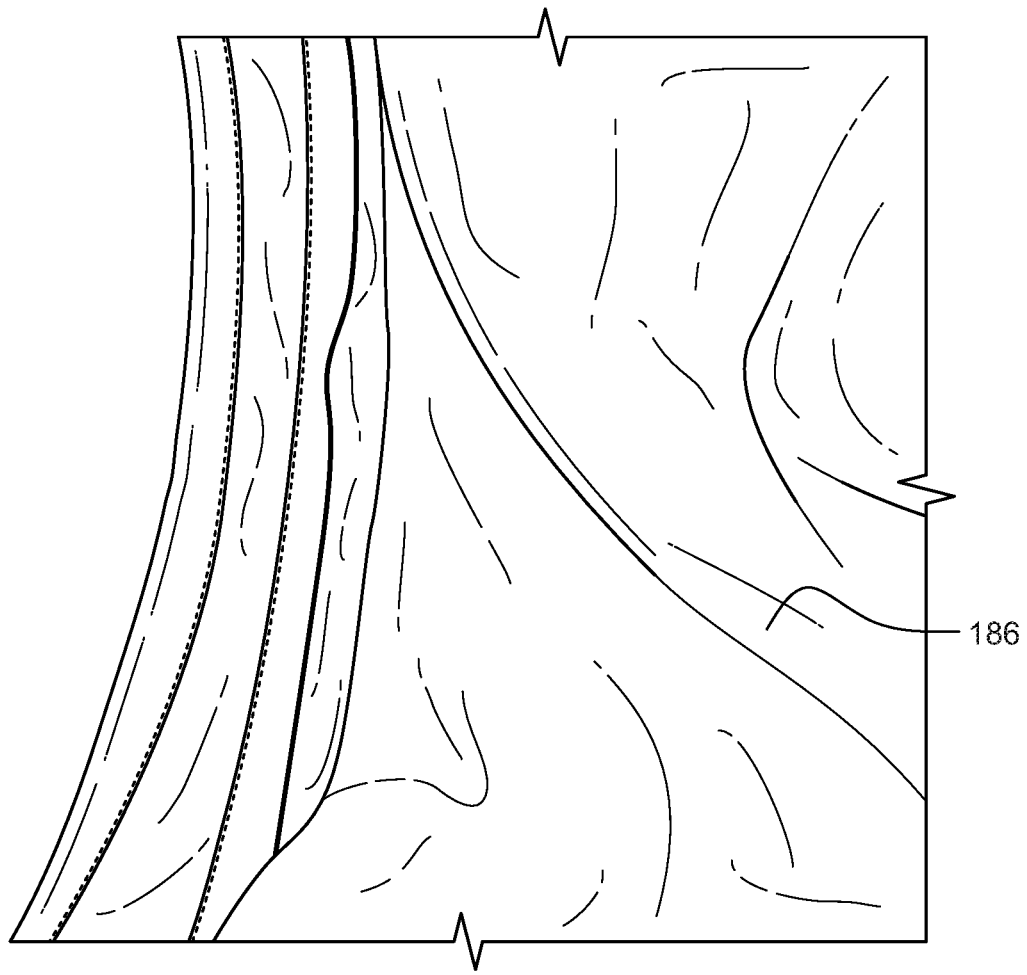
FIG. 26 is a diagrammatic partial view of an example a hand pocket attachment seam in a Faraday enclosure apparatus in accordance with the present disclosure.

Referring to FIG. 26, in particular preferred embodiments of the shielded enclosure 100, the hand pockets may be attached the conductive fabric in the enclosure by a combination of sewing and conductive adhesive. In the past, it may have been difficult to sew a material like that used in the hand pockets to a material like the conductive fabric, due to the delicacy of the fabric and the impact that sewing needle holes present to the shielding. The present disclosure overcomes this hurdle by, for example, using highly-conductive adhesive over all or partial seams created during sewing. For the hand pockets, the general construction method include the following: (a) sewing the hand pocket to the conductive fabric in the main cavity, (b) covering the seam between the hand pocket and the conductive fabric in the main cavity with conductive adhesive. Protrude the conductive adhesive enough to create another surface to sew into, (c) sewing through the conductive adhesive to attach the hand pocket and the conductive fabric to the outer protective material, which in this embodiment is ballistic nylon.

Using such a method, there may only be one seam between the hand pocket and the conductive liner, which could be covered with conductive adhesive. No other seams would penetrate into the main cavity after this seam, therefore sealing the main cavity from RF signals. Other embodiments may not use conductive adhesive at all, or may use a different material to connect the hand pocket to the main cavity of the enclosure. For example, conductive hook and loop, magnets, or any other material may be used.

Figure 27:
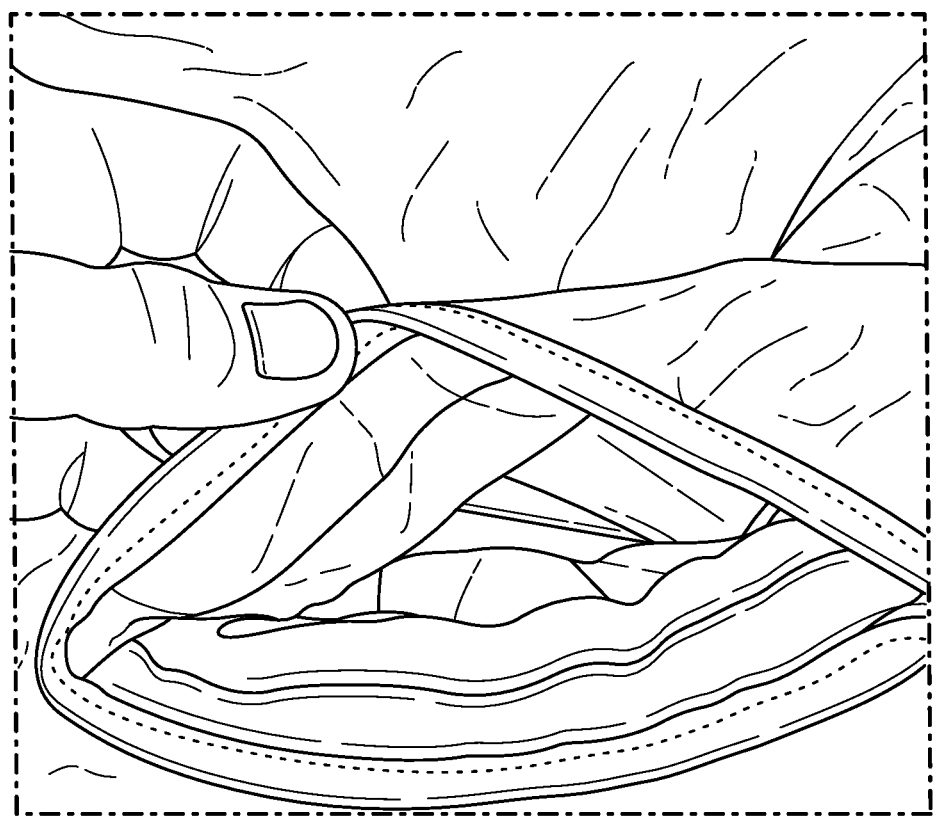
FIG. 27 is a diagrammatic partial view of an example slot-style hand pocket attachment seam in accordance with the present disclosure.

Referring to FIG. 27, another image of the hand pocket attached to the conductive fabric in the main cavity of an alternate embodiment of the disclosed shielded enclosure is shown. In this alternate embodiment, the hand pocket may be more like a "slot-style" hole than in other embodiments of the enclosure 100. This type of opening may certainly be used, but is more likely used with "softer-sided" enclosures than that presented in the preferred embodiment. The conductive adhesive may extend further into the hand pocket, and may be used as a form of RF sealant on all seams in the enclosure.

Figure 30:
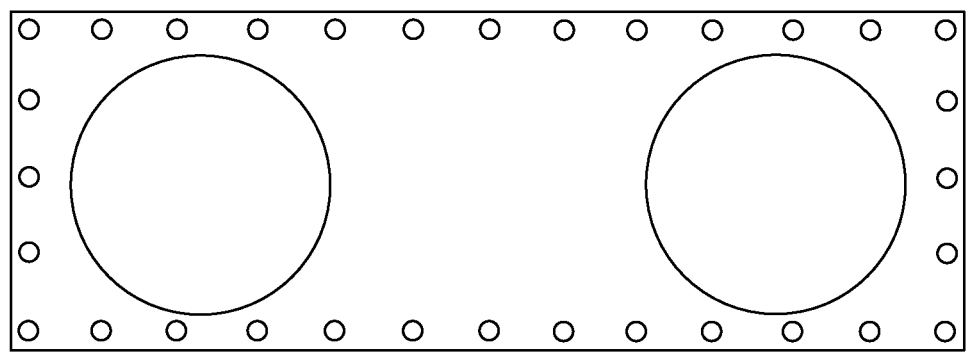
FIG. 30 is a diagrammatic plan view of an example glove interface panel to facilitate attachment of conductive hand pockets or gloves to the main cavity of the Faraday enclosure.
Figure 31:
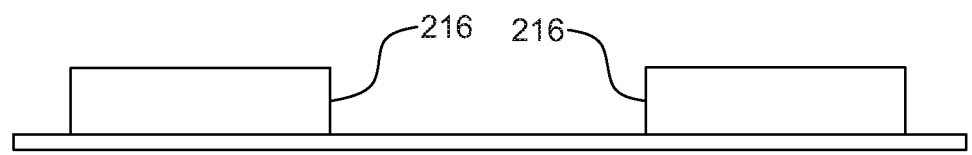
FIG. 31 is a diagrammatic side view of the glove interface panel of FIG. 30.
Figure 32:
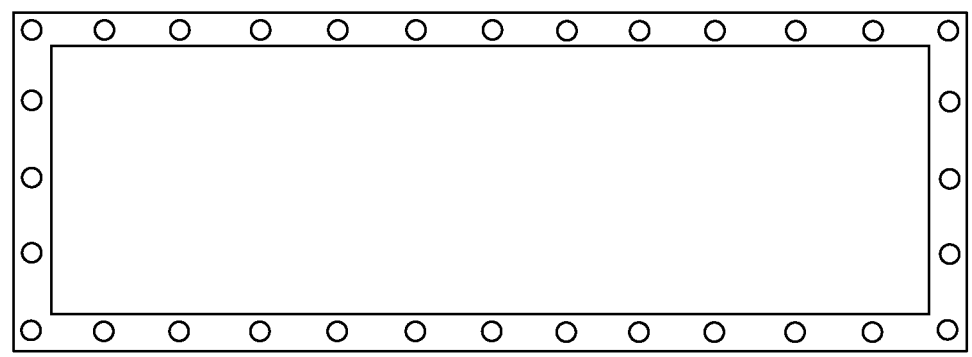
FIG. 32 is a diagrammatic plan view of an example backing ring for use in mounting the glove interface panel of FIG. 30 to the wall of the Faraday enclosure.
Figure 33:
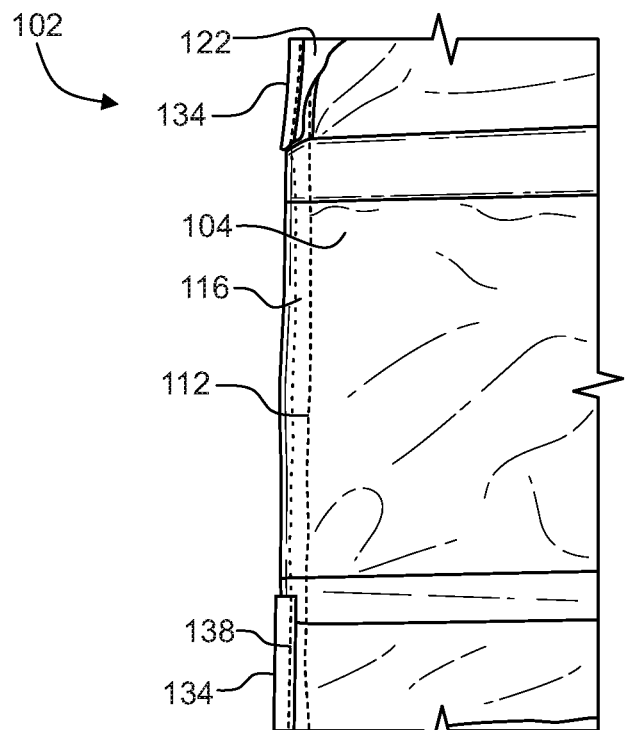
FIG. 33 is a diagrammatic partial view of an example seam portion in accordance with the present disclosure, wherein the binding element and protective layer are shown partially stripped away so as to reveal an inner stitching line and shielding allowance flap thereunder.
Figure 34:
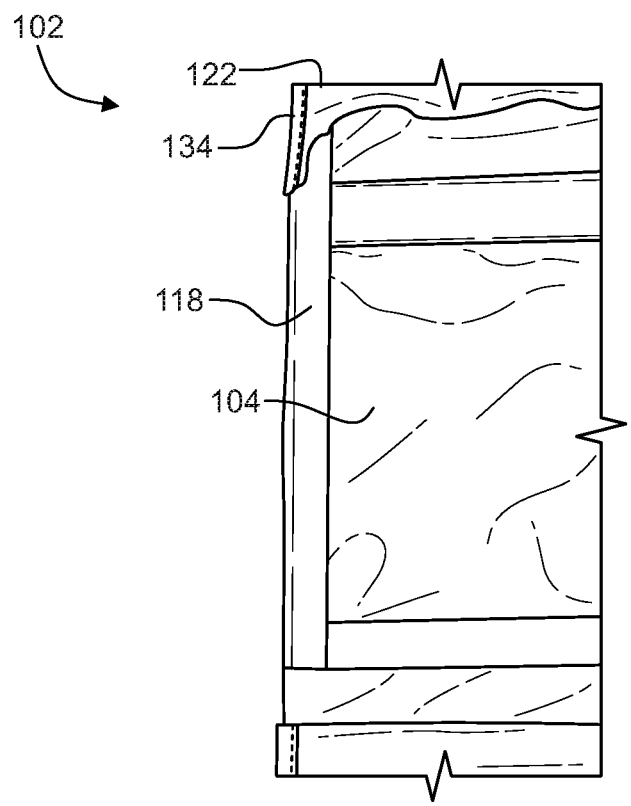
FIG. 34 is a diagrammatic partial view similar to that of FIG. 33, but wherein conductive adhesive tape is shown affixed to the first shielding layer and shieldingly covering the inner stitching line.

Referring to FIGS. 30-32, in certain embodiments, a metal panel may be used to facilitate attachment of the hand pockets to the main cavity of the enclosure. The metal panel may include a flat portion with holes, and short tubes attached to the holes. The hand pockets can be placed onto the tubes and held in place with pipe clamps. The panel can be attached on all sides to conductive fabric, with the backing ring on the opposing side of the conductive fabric. Screws can then be used to sandwich the fabric between the place and the backing ring. In the preferred embodiments, attachment of the hand pockets to the main cavity of the enclosure may be a delicate and time consuming process during manufacturing, whereas this metal panel may offer a cheaper, more effective, and more consistent process. Additionally, the gloves may be replaceable by the customer when they wear out, a feature which may often be desired by end-users.

Referring to FIGS. 28 and 29, the main cavity of particular preferred embodiments of an enclosure 100 may also include an RF/EMI filter 190 which holds connections from outside of the cavity to inside (such as AC power and USB). This filter may be mounted through the enclosure. This filter may include a flange on one side of the conductive fabric and a "backing ring" on the other side of the conductive fabric, held together by screws. In certain preferred embodiments, the conductive fabric may be located internally, meaning the other materials used (such as plastic sheeting and ballistic nylon used for structure and protection), may be external to the conductive fabric. Because the filter may "clamp" to the internal and external portions of the conductive fabric, it could not clamp to the other materials without another mechanism to hold it in place. For this reason, another backing ring may be used on the very outside of the enclosure. There may be two backing rings at different positions within the layers of the enclosure, and the screws may penetrate through the backing rings and into the flange of the filter. This method of attaching the filter may allow the filter to remain firm and seated within the enclosure, while allowing it to maintain the tightest and most conductive connection to the conductive fabric.

In other embodiments of the enclosure 100, the filter unit 190 may connect to the main cavity 142 via an outer "tube-like" structure, or by any other means which may secure it in place, or even not secure it yet leave it free floating. In other embodiments there may not be a filter unit at all.

Referring to FIGS. 3-8, 33 and 34, in particular preferred embodiments of the shielded enclosure 100, a particular method of seam construction may be used to increase the level of RF shielding. The floor, roof and walls of the enclosure may be connected using outer seams, then inner seams may be placed on all sides inside of the outer seams. The inner seams may pull the fabric in the corners together into a single point, instead of the multiple points which may occur during the sewing process of the outer seams. The extra material in between the inner seams and the outer seams may be used as a "flap" onto which any other materials, such as the protective outer ballistic nylon, may be sewn, without penetrating the main cavity of the enclosure and subsequently allowing signal to penetrate the enclosure. After the inner seams are placed, the inner and outer seams may be covered with conductive adhesive, which may seal the holes created by the inner seam. After conductive adhesive is applied, additional materials can be sewn to the "flap" on all sides to complete and finish the enclosure. Using this construction method, soft-sided and semi-soft-sided RF enclosures may be created with size and features typically reserved for hard-sided RF enclosures in the prior art.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:
1. A Faraday enclosure apparatus comprising:
   a seam portion including
      a first shielding layer having a first shielding edge and being comprised of electromagnetic shielding material;

a second shielding layer having a second shielding edge and being comprised of electromagnetic shielding material;

an inboard stitching line extending in parallel with the first shielding edge at a first distance therefrom, the inboard stitching line stitchingly securing the first shielding layer to the second shielding layer, thereby defining a shielding allowance flap between the inboard stitching line and the first and second shielding edges;

a first conductive adhesive element affixed to the first shielding layer in straddling sealing engagement with the inboard stitching line;

a second conductive adhesive element affixed to the second shielding layer in straddling sealing engagement with the inboard stitching line;

a first protective layer having a first protective edge portion;

a second protective layer having a second protective edge portion; and an outboard stitching line extending in parallel with the first shielding edge at a second distance therefrom, the second distance being less than the first distance, the outboard stitching line stitchingly securing the first and second protective edge portions to opposing sides of the shielding allowance flap.

2. A Faraday enclosure apparatus as defined in claim 1, wherein
(a) the first conductive adhesive element is disposed between the first protective layer and the first shielding layer; and
(b) the second conductive adhesive element is disposed between the second protective layer and the second shielding layer.

3. A Faraday enclosure apparatus as defined in claim 2, wherein the conductive adhesive elements are comprised of conductive adhesive tape.

4. A Faraday enclosure apparatus as defined in claim 3, wherein the conductive adhesive elements are laterally centered on the inboard stitching line.

5. A Faraday enclosure apparatus as defined in claim 3, wherein the outboard stitching line extends through the protective edge portions, the conductive adhesive elements and the shielding allowance flap.

6. A Faraday enclosure apparatus as defined in claim 3, further comprising a binding element, wherein
(a) the stitching securement of the first and second protective edge portions to opposing sides of the shielding allowance flap defines a seam flap; and
(b) the binding element wraps around the seam flap from the first protective edge portion to the second protective edge portion.

7. A Faraday enclosure apparatus as defined in claim 6, further comprising a binding stitching line, wherein
(a) the binding element is comprised of an elongated strip defining a pair of laterally opposed binding edge portions; and
(b) the binding stitching line extends through the binding edge portions and the protective edge portions.

8. A Faraday enclosure apparatus as defined in claim 7, wherein the binding stitching line further extends through the shielding allowance flap.

9. A Faraday enclosure apparatus as defined in claim 8, wherein the binding stitching line further extends through the conductive adhesive elements.

10. A Faraday enclosure apparatus as defined in claim 1, wherein the protective layers are comprised of ballistic nylon material.

11. A Faraday enclosure apparatus as defined in claim 1, wherein the shielding layers are comprised of multiple shielding sublayers comprised of electromagnetic shielding material.

12. A Faraday enclosure apparatus as defined in claim 1 further comprising
(a) a main cavity at least partially defined by multiple said seam portions; and
(b) a pair of side wall support elements configured to be moved between extended configuration and folded configurations, wherein
(i) the main cavity is supported in a volumetrically open configuration when the side wall support elements are in the extended configuration, and
(ii) the main cavity is collapsible to a volumetrically closed configuration when the side wall support elements are in the folded configuration.

13. A method of manufacturing a seam portion of a Faraday enclosure apparatus, the method comprising:
providing a first shielding layer and a second shielding layer, the first shielding layer having a first shielding edge and the second shielding layer having a second shielding edge;
generating an inboard stitching line extending in parallel with the first shielding edge at a first distance therefrom, the inboard stitching line stitchingly securing the first shielding layer to the second shielding layer, thereby defining a shielding allowance flap between the inboard stitching line and the first and second shielding edges;
affixing a first conductive adhesive element to the first shielding layer in straddling sealing engagement with the inboard stitching line;
affixing a second conductive adhesive element to the second shielding layer in straddling sealing engagement with the inboard stitching line;
selecting a first protective layer and a second protective layer, the first protective layer having a first protective edge portion and the second protective layer having a second protective edge portion; and
producing an outboard stitching line extending in parallel with the first shielding edge at a second distance therefrom, the second distance being less than the first distance, the outboard stitching line stitchingly securing the first and second protective edge portions to opposing sides of the shielding allowance flap.

14. A method as defined in claim 13, wherein
(a) the first conductive adhesive element is disposed between the first protective layer and the first shielding layer; and
(b) the second conductive adhesive element is disposed between the second protective layer and the second shielding layer.

15. A method as defined in claim 14, wherein the conductive adhesive elements are comprised of conductive adhesive tape.

16. A method as defined in claim 15, wherein the conductive adhesive elements are laterally centered on the inboard stitching line.

17. A method as defined in claim 15, wherein the outboard stitching line extends through the protective edge portions, the conductive adhesive elements and the shielding allowance flap.

18. A method as defined in claim 15, further comprising a supplying a binding element, wherein
   (a) the stitching securement of the first and second protective edge portions to opposing sides of the shielding allowance flap defines a seam flap; and
   (b) the binding element wraps around the seam flap from the first protective edge portion to the second protective edge portion.

19. A method as defined in claim 18, further comprising forming a binding stitching line, wherein
   (a) the binding element is comprised of an elongated strip defining a pair of laterally opposed binding edge portions; and
   (b) the binding stitching line extends through the binding edge portions and the protective edge portions.

20. A method as defined in claim 19, wherein the binding stitching line further extends through the shielding allowance flap.

21. A method as defined in claim 20, wherein the binding stitching line further extends through the conductive adhesive elements.

22. A method as defined in claim 13, wherein the shielding layers are comprised of electromagnetic shielding material.

23. A method as defined in claim 22, wherein the shielding layers are comprised of multiple shielding sublayers comprised of electromagnetic shielding material.

24. A method as defined in claim 13, wherein the protective layers are comprised of ballistic nylon material.

25. A method as defined in claim 13 further comprising forming a main cavity within the Faraday enclosure apparatus, the main cavity being at least partially defined by multiple said seam portions.

\* \* \* \* \*